United States Patent [19]

Angleton et al.

[11] Patent Number: 4,724,531
[45] Date of Patent: Feb. 9, 1988

[54] GATE ARRAY WITH BIDIRECTIONAL SYMMETRY

[75] Inventors: Joseph L. Angleton, Canoga Park; Jeffery L. Gutgsell, Simi Valley, both of Calif.

[73] Assignee: Hughes Aircraft Company, Los Angeles, Calif.

[21] Appl. No.: 632,099

[22] Filed: Jul. 18, 1984

[51] Int. Cl.$^4$ ............................................. G11C 13/00
[52] U.S. Cl. .................................. 365/189; 365/230; 307/465; 357/41; 364/490
[58] Field of Search ................. 365/189, 230; 307/465

[56] References Cited

U.S. PATENT DOCUMENTS 4,431,928  2/1984  Skokan ................................. 307/465
4,556,947  12/1985 Prioste ................................ 307/465

Primary Examiner—Terrell W. Fears
Attorney, Agent, or Firm—Charles D. Brown; A. W. Karambelas

[57] ABSTRACT

The ease and versatility by which logic functions may be implemented in a semicustom CMOS gate array is substantially increased by disposing core cells within the gate array about a plane of mirror symmetry. Such a gate array is devised with mirror symmetry in two orthogonal directions. A memory design of general utility and with particular utility in a gate array is devised so as to operate with a programmable word length. The word length of the memory is programmed by choosing an appropriate integrated circuit metal mask option to be utilized in the memory circuit design at a data bus input and output mapping. In the event that the memory is entirely included within a large scale integrated circuit, such as a gate array, a circuit design is further devised for providing a self-test of the operability of such a fully included memory without the necessity of providing input/output pins communicating with the memory or other external test signals. The self-test is activated by applying a single external start signal at a corresponding single external circuit pin with an indication of failure at any point during a complete memory test cycle being coupled to a second external failure pin. A self-test protocol is utilized wherein an internal counter generates the addresses of each memory location and stores that address as data within the memory location and the inverse of the address as data. In each case, what was then written into the memory is compared to that which is later read from the memory to thereby validate operability of the memory.

2 Claims, 24 Drawing Figures

Fig. 2.
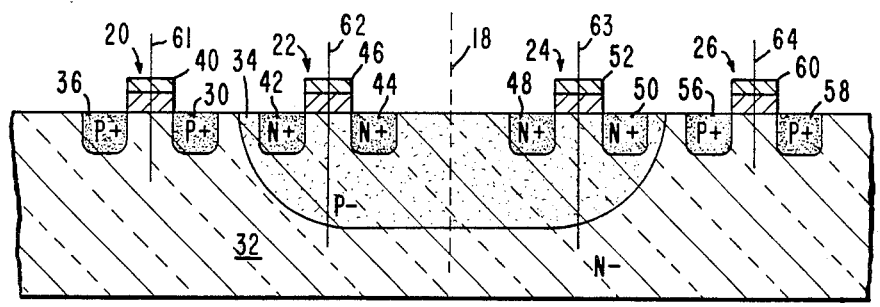
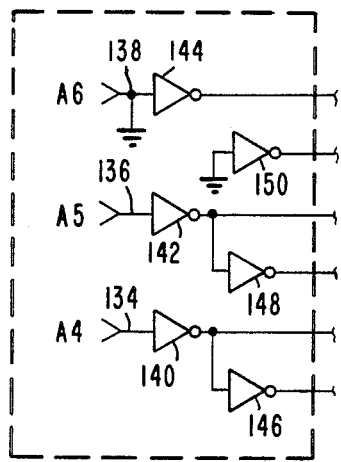
Fig. 6b.
Fig. 6c.
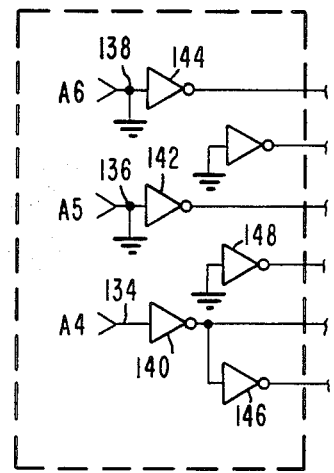

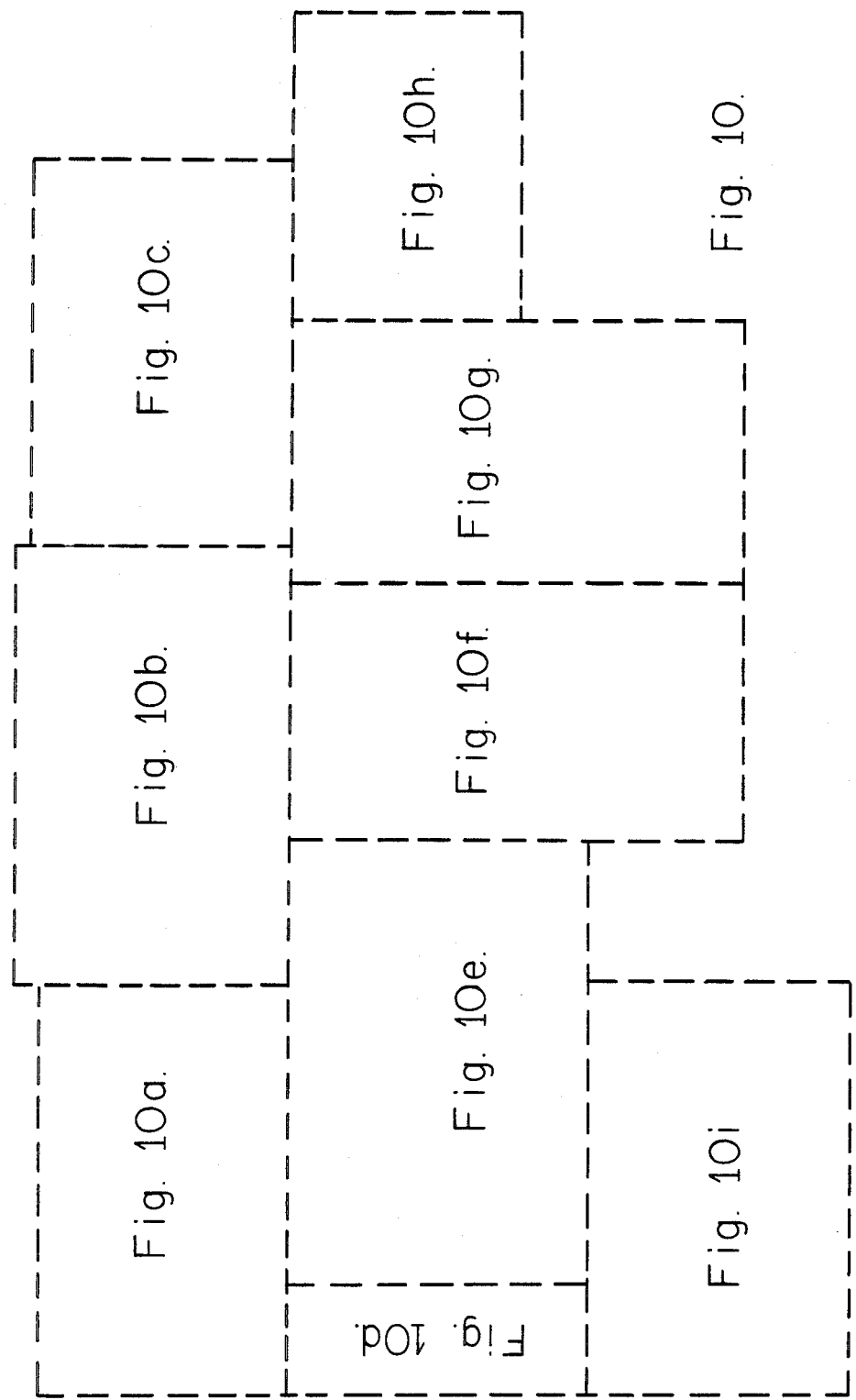

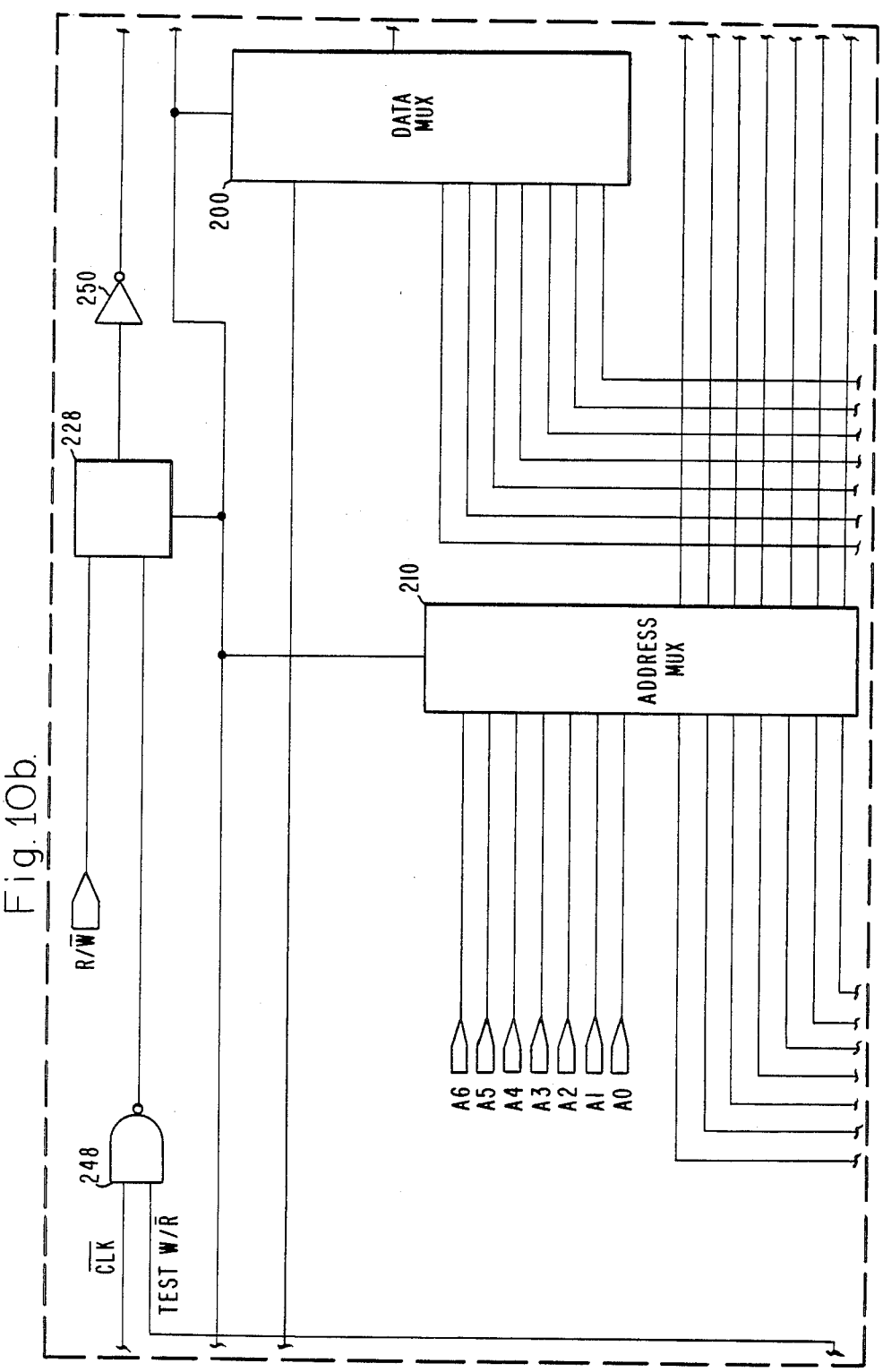

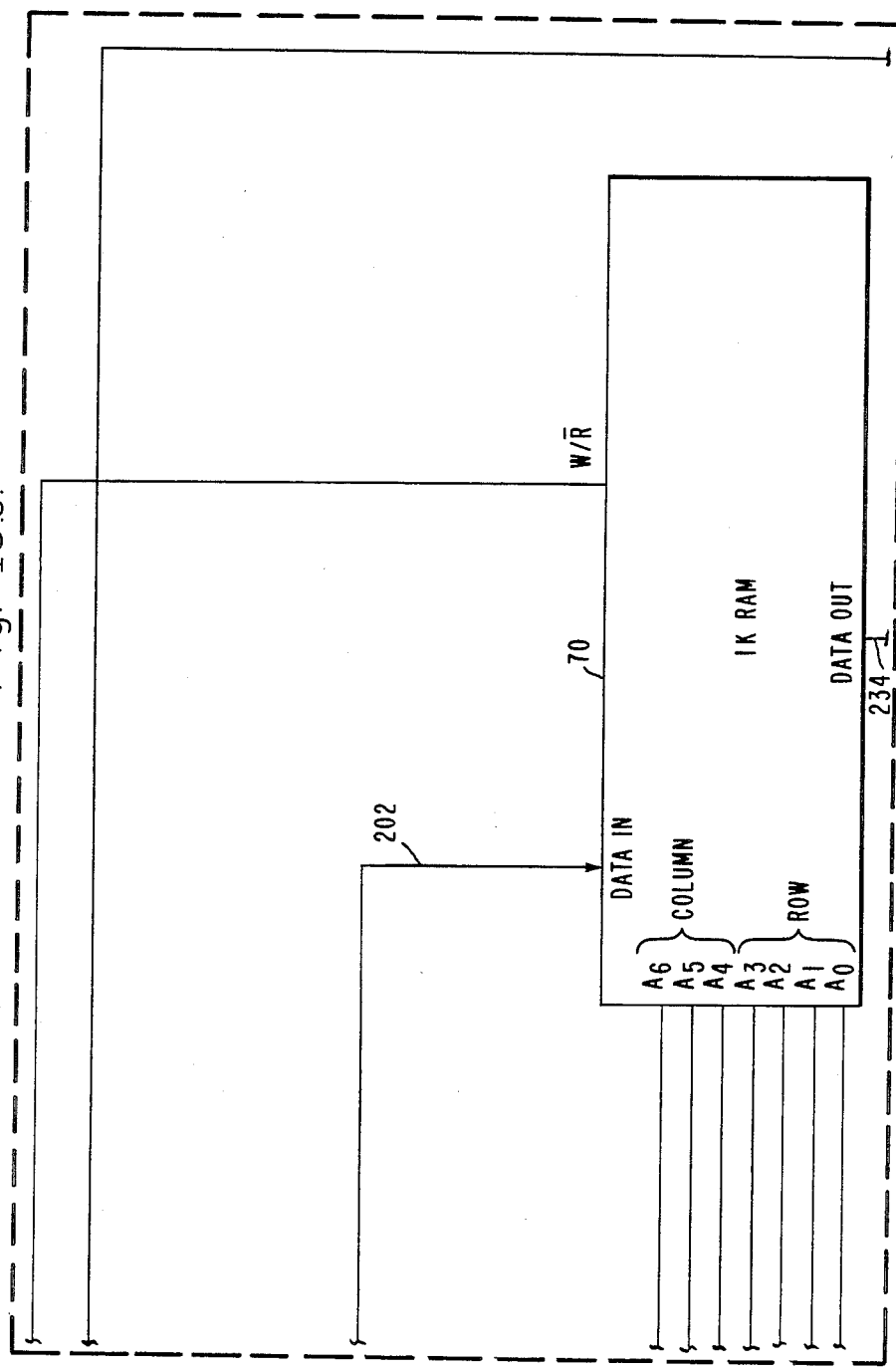

GATE ARRAY WITH BIDIRECTIONAL SYMMETRY

BACKGROUND OF THE INVENTION

1. Field of the Invention

The present invention is related to the field of integrated circuit memories and, in particular, to memory designs made on custom chips and, more specifically, on gate arrays or master slices.

2. Description of the Prior Art

It is well-known in the art to preprocess an integrated circuit up to its final stages of layout and to leave the last processing or fabrication steps for later differentiation by use of fuse links or metalization patterns. This is known as a semicustom chip which has come to provide an option falling between the high volume low cost standard logic chips and expensive handcrafted custom integrated circuits. There are basically three forms of semicustom logic chips presently used: (1) field programmable integrated circuits such as programmable array logic chips and field programmable logic arrays; (2) gate arrays or master slices; and (3) standard cell or polycell designs.

Often, with such semicustom chips, it becomes necessary to devote all or part of the available chip space to a memory. Often, such a memory will be totally isolated, i.e., will have no inputs or outputs which will be directly coupled to any of the chip pins.

Therefore, it becomes necessary in using semicustom chips to be able to design such internal memories in a manner not only which is consistent with the architecture of the remaining on-chip circuitry but which is capable of operating with some measure of reliability notwithstanding its electric inaccessibility to any circuit off the chip. Moreover, what is needed is a chip which is fabricated in such a manner that connections between circuit groups on the chip can be efficiently made, thereby maximizing both the ease and density by which complex circuits, including memories can utilize the available chip space.

At present, there is a reluctance to use semicustom chips for memories inasmuch as even the semicustom design of the memory is highly dependent upon the word length assumed within the architecture of the memory. Furthermore, semicustom chips often do not readily lend themselves to highly efficient use in complex circuits which may incorporate one or more internal memories. The preprocessed gates and the metalizations required to interconnect the gates often are not optimally situated on the chip for a highly efficient utilization in such complex circuits. Moreover, when memories are used in such complex circuits in semicustom chips and are necessarily isolated on the chip, no simple design or protocol has heretofore existed to allow the reliability of the memory to be determined when there is no input or output to the memory from the chip pins.

The present invention as described below and shown in the figures overcomes each of these shortcomings of the prior art.

SUMMARY OF THE INVENTION

The invention is an improvement in a CMOS gate array comprising a plurality of core cells. The core cells each include at least one P-type device and at least one N-type device arranged within the core cell in a predetermined layout or configuration. The plurality of core cells is disposed in the array or chip in at least two groups. One of the two groups is disposed in the chip so that the internal configuration of the core cells within that one group is the mirror image of the internal configuration of the core cells within the other one of the two groups.

The invention also comprises in such a CMOS gate array as described above a programmable word length memory. The memory comprises an addressable memory array, a plurality of drivers and a data bus. The plurality of drivers is coupled to the addressable memory and communicates with the memory array. The data bus is comprised of a plurality of data bus lines of a predetermined number equal to or less than the number of the plurality of drivers. The plurality of data bus lines is coupled to the plurality of drivers according to a predetermined metal mask mapping. The data bus is configured according to the mapping to correspond to a related word length having a bit length equal to the number of data bus lines.

The memory as described above also includes a self-testing circuit. This circuit is comprised of an address and data counter coupled to the memory for generating addresses of each location within said memory and for generating data for writing into each correspondingly addressed location. A control circuit is coupled to the memory for controlling read/write cycles of the memory in response to addresses and data generated by the address and data counter. An error detection circuit is coupled to the memory and to the address and data counter and compares data written into the memory (from the address and data counter under control of the control circuit) with data read from the memory in response to control by the control circuit. The error detection circuit detects errors found in that comparison and thereby internally checks the operability of the memory.

The invention is better understood by considering the following figures wherein like elements are referenced by like numerals.

BRIEF DESCRIPTION OF THE DRAWINGS

FIG. 2 is a simplified cross-sectional view in enlarged scale taken through line 2—2 of FIG. 1.

FIGS. 6A, 6B, 6C show a Y-address decoder as used in the memory of FIG. 3 configured for 8, 16 and 32 bit word length respectively.

FIG. 10 is a map showing how FIGS. 10a–10i fit together.

FIGS. 10b, 10c, 10f, 10g and 10h together comprise a schematic diagram of the error detection and latch circuitry as used in the self-test circuit of FIG. 9.

The invention and its various embodiments may be better understood by now turning to the followng detailed description as illustrated by the above-described figures.

DETAILED DESCRIPTION OF THE INVENTION

Figure 1:
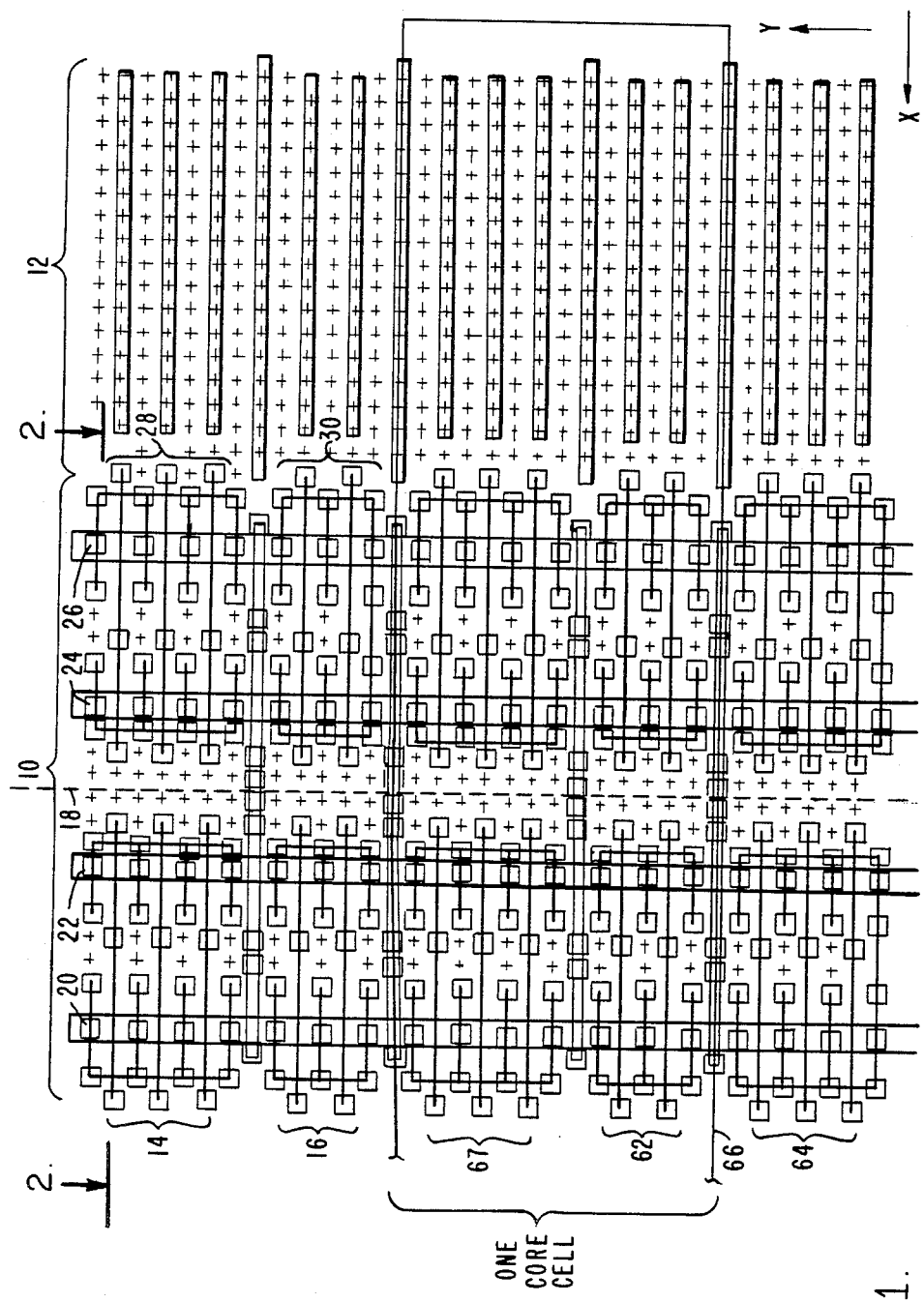
FIG. 1 is a diagrammatic plan view of the gate layout of a CMOS semicustom chip according to the invention.

The present invention is an improved design for a CMOS gate array chip wherein circuitry may be disposed with greater flexibility by organizing the N- and P-channel transistors in a semicustom chip to exhibit a mirror image symmetry about a predetermined line (e.g., line 18 in FIG. 1). More particularly, the CMOS semicustom chip has N- and P-channel devices which collectively form a core cell. A mirror image of the core cell is formed adjacent to each unit of the core cell about a line symmetry.

The invention further includes a design for a memory wherein the word length assumed or manipulated by the memory can be conveniently changed by selectively connecting certain circuit units. This design is particularly adaptable to semicustom chips although the design could be used with advantage in custom chips or standard chips as well.

The invention still further includes a circuit design which allows a memory to be completely self-tested without intervention from external circuitry. Again, although this design is of general utility, it is particularly advantageous in a situation where memory is placed internally within a complex chip design and where few input and output pins (if any pins at all) are available for direct communication with such an "on-chip" memory. The invention and its various embodiments is better understood by now referring to FIG. 1.

FIG. 1 is a diagrammatic plan view of the layout of a semicustom CMOS chip fabricated according to the invention. In the illustrated embodiment, a small portion of a 4000 gate array is depicted. The array is divided into two areas: (1) an active area 10; and (2) a routing area 12. Active area 10 includes the CMOS devices which perform the logic functions. The routing area 12 is used to interconnect the logic functions. Two layers of metalization are used for interconnection puposes. A first layer of metalization is laid on the Y direction as depicted in FIG. 1. A second layer of metalization is laid perpendicular thereto in the X direction. In the illustrated embodiment, the core cell comprises a three-input gate 14 and a two-input gate 16. The core cell, comprised of the three-input gate 14 and two-input gate 16 is replicated about a line 18 of mirror symmetry. As seen in FIG. 1, the first three-input gate 14 is characterized, starting from the edge of the chip, by a P-channel device 20 followed by an N-channel device 22. On the opposing side of line of symmetry 18 is a symmetric N-channel device 24 and P-channel device 26 which comprise the N- and P-channels of a mirror symmetric three-input gate, generally denoted by reference numeral 28. Thus, gate 28 is mirrored by gate 14 and, similarly, two-input gate 16 is a mirror image of two-input gate 30.

The next adjacent core cell, again comprised of a three-gate input and two-gate input is reduplicated in the Y direction with the mirror symmetry being provided in the X direction as depicted in FIG. 1. The core cells thus duplicate in a mirror symmetric pair-wise fashion along the Y length of active area 10.

The chip's symmetry can better be understood by referring to FIG. 2 which is a cross-sectional view taken through line 2—2 of FIG. 1. The semiconductive substrate, generally denoted by reference numeral 32, is lightly N-doped. N-channel device 22 is fabricated within substrate 32 by depositing a large lightly P-doped well 34 in which two heavily N-doped regions, serving as the source 42 and drain 44, are deposited. A conductive gate 46 is disposed over the P-doped channel between source 42 and drain 44. Similarly, P-channel device 20 is comprised of a heavily P-doped source 36 and drain 38 with an interlying conductive gate 40 disposed over the N-doped channel. The next adjacent devices 24 and 26 are thus fabricated with a mirror symmetry about plane 18. P-channel device 26 is comprised of P-doped source 56 and drain 58 and a conductive gate 60 overlying a lightly N-doped channel. Device 26 is thus the exact mirror image of device 20. Similarly, N-channel device 24 is the mirror image of N-channel device 22 and is disposed in the P-well 34 with source 48 and drain 50 separated by a conductive gate 52. Additional layers of insulating oxides and metalization have been omitted from the cross-sectional view of FIG. 2 and the plan view of FIG. 1 for the purposes of simplicity and clarity. The transistors 20, 22, 24 and 26 as depicted in FIG. 2 are rotated 90 degrees about axes 61, 62, 63 and 64. This was done so as to detail the structure of the transistors and illustrate the mirror symmetry about the Y axis (represented by plane 18).

Thus, as best described and as best shown in FIG. 1 in plan view, the layout of P- and N-channel devices within substrate 32 is mirror symmetric about the Y axis (represented by plane 18). A mirror symmetry is also exhibited about the X axis with a translation of one-half of a core cell. In other words, the structure of three-input gate 14 and two-input gate 16 also finds a mirror symmetrical pair in two-input gate 62 and three-input gate device 64, if one were to displace an X plane of symmetry in the Y direction through half of the core cell, in this case skipping over one three-input gate device 67. This mirror symmetry facilitates the ease of data flow on the chip. For example, data may be parallel transferred out of a shift register through an arithmetic logic unit (ALU) into another shift register. Imagine the inputs in such a shift register to be disposed in the chip at the bottom (as seen in FIG. 1) of the core cells. Data thus flows from the inputs at the bottom of the cells to the outputs at the top. Control signals, such as clocking, would flow orthogonal to the data flow. Another logic data flow, instead of moving upwardly across the chip, would be moving downwardly. In the prior art, such a reversal of data flow within a semicustom chip doubled the amount of design effort in a gate array. However, according to the invention, mirror core cell symmetry permits data flow up or down the Y axis for any given logic function and by simply translating across a plane of mirror symmetry line parallel to the X axis, a reversal of data flow can be accommodated with no additional design effort. The result is a substantial reduction in engineering layout time.

In fact, in semicustom gate arrays, partucularly larger arrays, economical layout is not accomplished by interconnecting gates but by interconnecting logic fucntions. These logic functions are comprised of a plurality of cell designs included with the designer's "cell library". Such a cell library may, in fact, be stored within the memory of an automatic router which accepts the basic topography of the gate array and power busses, and then lays out, through a computer assisted design routine, logic functions taken from its cell library. Such logic functions may include large counters, ALUs, multiplexers and the like. It is not uncommon, for example, for a 4K gate array to include logic functions which comprise cells of the order of 500 gates.

Because the design of a semicustom gate array is not accomplished by the connection of individual transistors, but by connection of higher level logic functions, symmetry of the core element becomes critical to the ease with which such a design can be accomplished. A particular layout for an ALU may have inputs at the bottom and outputs at the top of the ALU cell. It may turn out that an adjacent logic function may also have inputs at the top and outputs at the bottom. If the circuits in the chip do not have any inherent mirror symmetry, it would be necessary to have two layout variations of the same cell, one for signal flow from bottom to the top and the other for signal flow from top to bottom. Left and right variations would also be required. Design flexibility with respect to data flow and reversals of data flow are thus highly facilitated by the mirror symmetry of the P/N-N/P-structure described above as one moves along in the X direction and by the core cell mirror symmetry as one moves along in the Y direction after a displacement of a half-core cell.

In the preferred embodiment, substrate 32 is designed to accommodate 16 bit words. Although only two rows of gates are shown in FIG. 1 (a single row being defined by a P-channel device 20 adjacent to an N-channel device 22, and similarly with respect to N-channel device 24 and P-channel device 26) in the preferred embodiment, half of the chip is 18 rows wide in order to accommodate a 16 bit structure plus two extra rows of devices to accommodate any special control signals. In general, data flows up the chip in a Y direction utilizing 18 or half of the rows of devices and then moves across the chip in the X direction to utilize the other half of the chip also organized in 18 rows. Inputs would thus be generally provided at the bottom of the chip in the Y direction with outputs at the top of the chip with control signals moving orthogonally to the data flow. This type of data flow is particularly facilitated through the use of the mirror symmetrical rows particularly described in connection with FIGS. 1 and 2 above.

As gate arrays and semicustom chips increase in size, larger portions of the system logic design are taken into large scale integration (LSI). Even small amounts of on-chip memory thus drive the pin count of such large integrated chips so high that efficient utilization of the gate array is substantially reduced. For example, out of 4,000 gates, it would not be uncommon to use only approximately 1,000 because it is necessary to provide a memory off the chip. Therefore, it is highly desirable to be able to include memory within the gate array itself.

There are at least two problems associated with including memory in the gate array. First, the gate array designer will have no predefined idea as to the ultimate application of the memory, and thus testing of the memory may be impossible. Secondly, it cannot be assumed that the system in which the gate array on-chip memory will be operating will be an 8 bit, 16 bit or a 32 bit system. Therefore, as a result of these difficulties, a memory design has been devised according to the invention in which the word length is programmable by selective deposition of metalization with a single logic function layout. As will be seen in the description below, redundant circuit elements are employed in the memory so that programmability of word length can be achieved by metal mask options.

Figure 3:
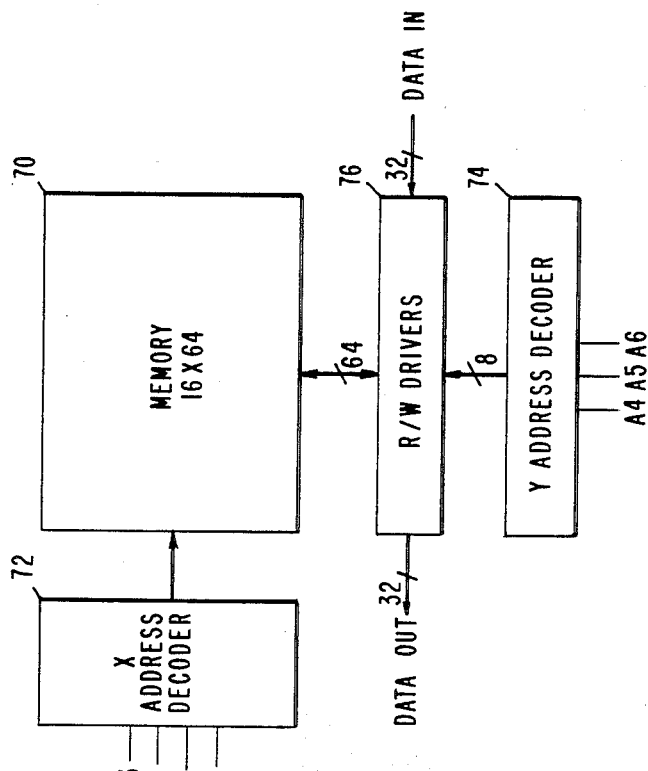
FIG. 3 is a block schematic diagram of a programmable word length memory as more specifically described in connection with FIGS. 4-8a, b.

Turn now to FIG. 3 wherein an overall block schematic diagram of a programmable word length memory is illustrated.

Figure 7:
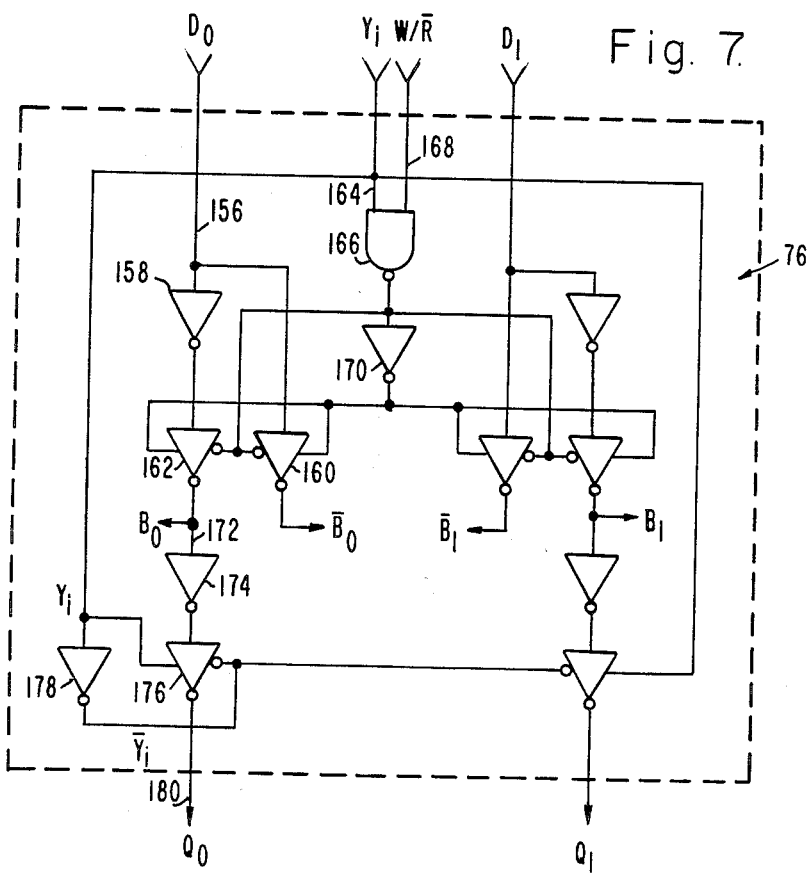
FIG. 7 is a read/write circuit as used in the memory of FIG. 3.
Figure 5:
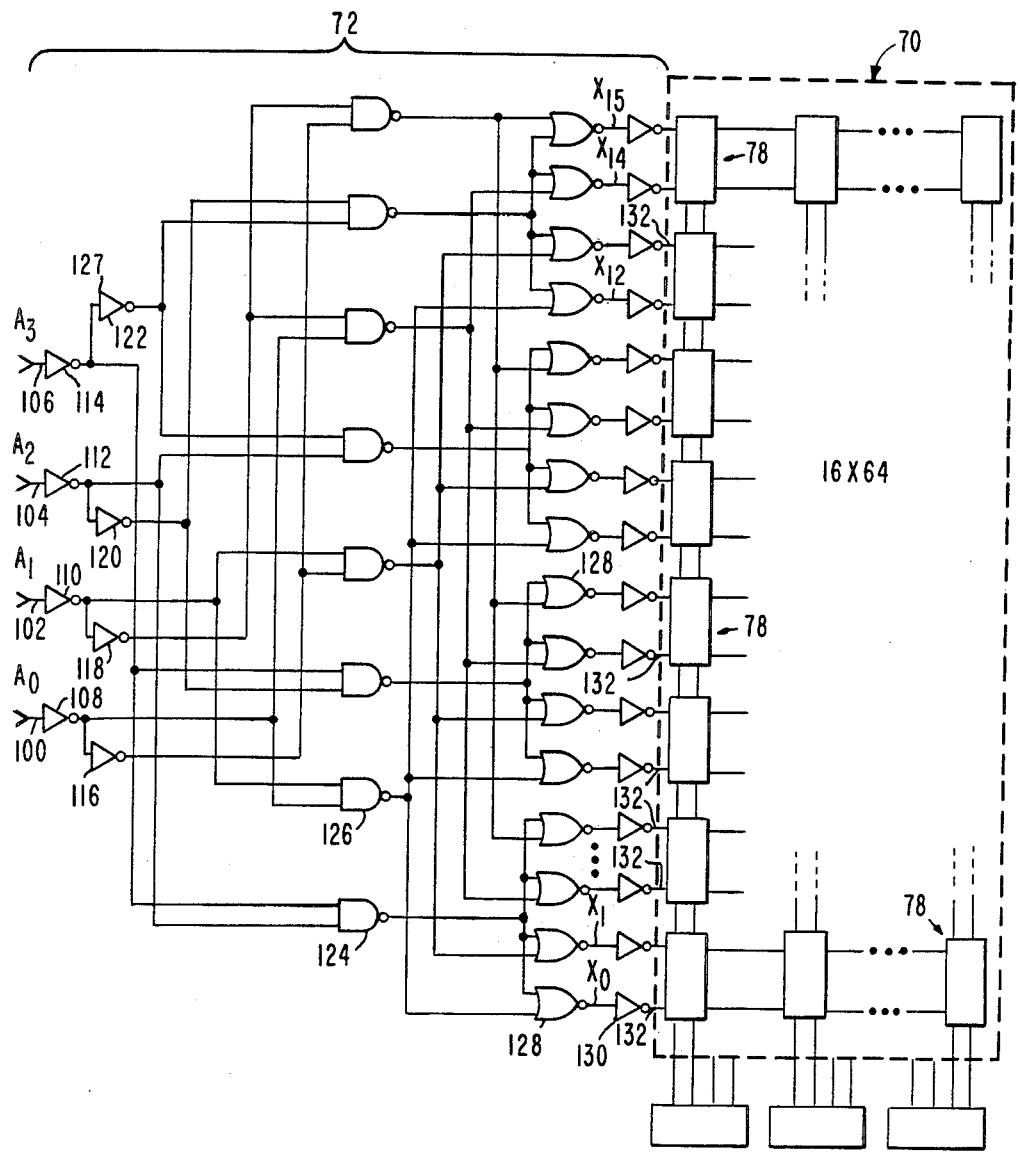
FIG. 5 is a schematic diagram of an X-address decoder as used in the memory of FIG. 3.

A random access memory 70 is accessed by means of an X-address decoder 72 and a Y-address decoder 74, shown in greater detail in FIGS. 5 and 6, respectively. Four address inputs A0–A3 are decoded through a logic synthesized circuit, described in greater detail in connection with FIG. 5, to access one of 16 rows of memory 70. Y-address decoder 74 is a three-to-eight decoder with inputs A4–A6 used to access one of eight groups of 32 read/write dual drivers 76. Thirty-two read/write dual drivers 76, such as described in greater detail in connection with FIG. 7, are used to select the columns of memory 70 which are accessed.

Figure 4:
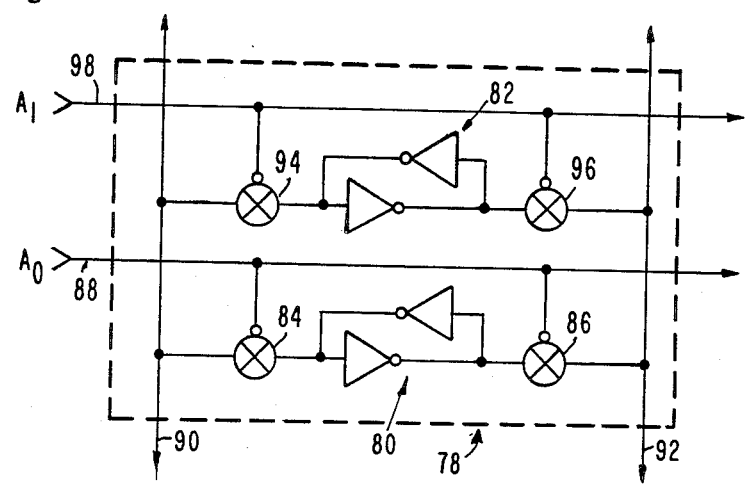
FIG. 4 is a schematic diagram of the memory cell used in the memory of FIG. 3.

Turn, however, first to FIG. 4 wherein a single memory cell 78 of memory 70 is depicted in greater detail. Memory cell 78 is a conventional six-transistor static ram cell employing a first latch circuitry 80 and a second latch circuitry 82. Thus, memory cell 78 is capable of storing two bits. Consider latch circuit 80. Latch circuit 80 is accessed through two identical switching transistors 84 and 86 which are controlled by a row address line 88. The input and output of latch 80 is provided on a column line 90 which is represented by a signal, B, and a column line 92 which represents the complementary signal, B̄. Therefore, if row address line 88 goes active low, access devices 84 and 86 become conductive thereby permitting the bit and its complement to be written respectively on lines 90 and 92 and to be written into latch 80. A bit is then stored within latch 80 and is read out by similarly accessing devices 84 and 86. Devices 84 and 86 are P-channel transistors which provide a somewhat faster switching time in the N-channel substrate assumed in the illustrated embodiment. For CMOS processes optimized more for memory products than for general logic functions, N-channel transistors would be the prefered transistor polarity. Latch 82 is similarly provided with access transistors 94 and 96 coupled to address input line 98. Thus, latch 82, whose outputs are also coupled to column lines 90–92, operates in an identical manner.

Turn now to FIG. 5 wherein X-address decoder 72 of FIG. 3 is schematically depicted. Four input addresses A0–A3 are provided to inputs 100–106 of inverters 108–114. The outputs of these inverters are again inverted by inverters 116–122 so that the addresses and their complements are provided as inputs to a NAND/-NOR logic synthesis. Consider the zeroth bit for example. NAND gates 124 and 126 have outputs coupled to the inputs of NOR gate 128. The output of NOR gate 128 is again inverted and represents the zeroth order row line X0. The inputs to NAND gate 124 are the signals A2 and A3 from inverter 112 and 114, respectively. Therefore, the output of NAND gate 124 is always true unless both of its inputs are true, in which case the output is false. NAND gate 126 similarly has the input A0 and A1 from inverters 108 and 110, respectively. The output of NAND gate 126 is similarly always true unless both of its inputs are true, in which case it is false. The output of NAND gates 124 and 126 are thus coupled to the inputs of NOR gate 128. The output of NOR gate 128 will always be false unless both of its inputs are false in which case its output is true. Therefore, the output of NOR gate 128 will be true only in that case where A0–A3 are each false. In other words, when the address 0000 is presented to X decoder 72, NOR gate 128 will have a true output which is then again inverted by inverter 130 and which drives an address line, such as line 88 as described in connection with FIG. 4, to access a row of corresponding memory cells. Otherwise, the output of NOR gate 128 remains false at all other times.

A similar analysis of each of the other NOR gates depicted in FIG. 5 together with their corresponding NAND gates could likewise be made with the result that outputs 132 of the NOR gates (and like NOR gate 128) comprise sixteen selectable row lines of which only one goes active low corresponding to each 4 bit address presented at the inputs 100–106 of X-address decoder 72.

Figure 6A:
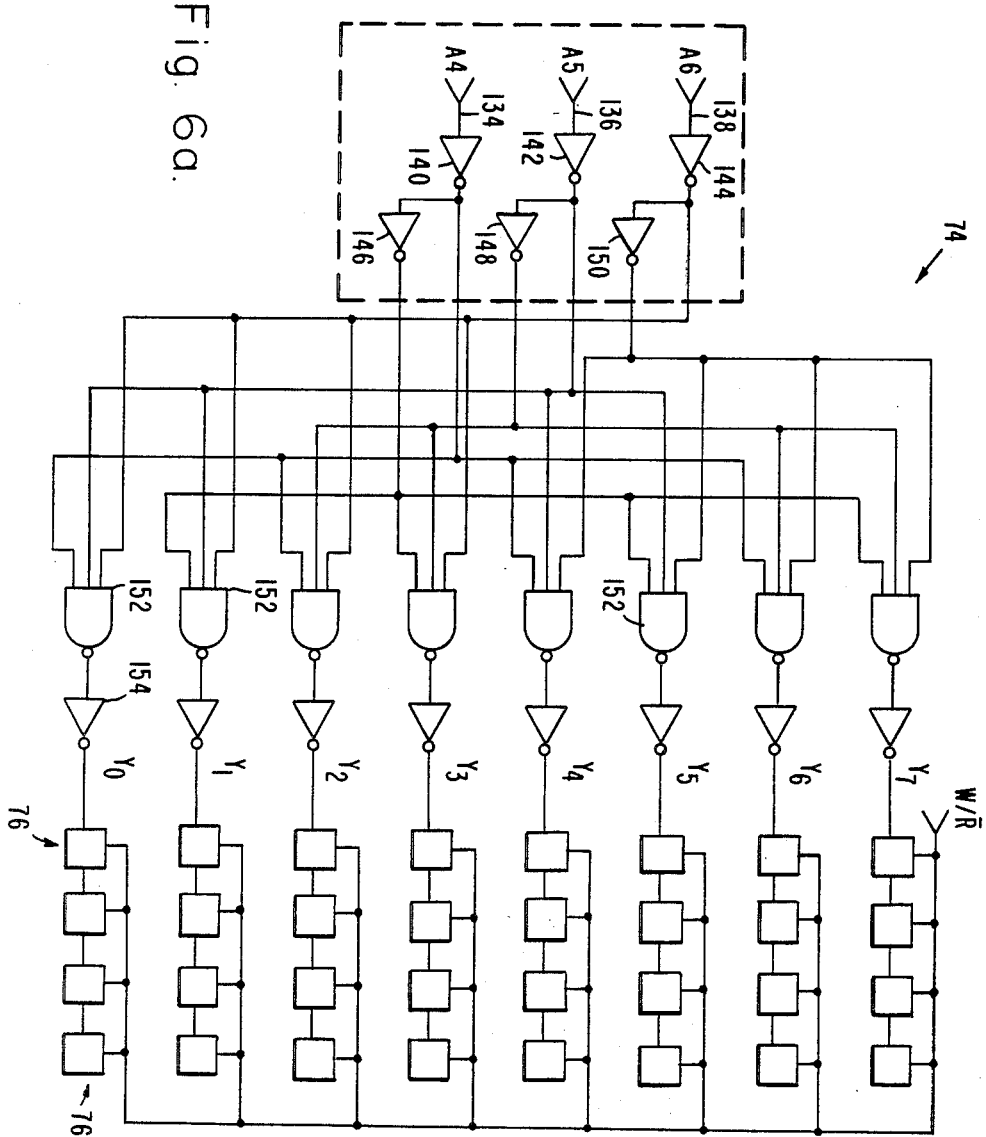

Turn now to FIG. 6A which is a schematic diagram of Y-address decoder 74 configured to decode an 8-bit word length. The Y address, comprised of signals A4–A6, is coupled to inputs 134–138 of inverters 140–144. Again, the outputs of inverters 140–144 are also coupled to the inputs of corresponding inverters 146–150. The signals A4–A6 and A4–A6 are thus made selectively available to inputs of NAND gates 152. Consider lowermost NAND gate 152 in FIG. 6A which has three inputs selectively chosen from the six available signals from the outputs of inverters 140–150. In the case of NAND gate 152, its inputs are the signals A4, A5 and A6. The output of NAND The output of NAND gate 152 will always be true unless each of its inputs are true, in which case its output is false. Therefore, the output of NAND gate 152 will be false only with the Y address 000. The output of NAND gate 152 is provided as input to inverter 154 which provides an inverted logic signal to the Y address input at a corresponding group of four of the thirty-two read/write dual drivers 76.

FIG. 6B is a schematic diagram of a portion of the Y-address decoder 74 re-configured so as to decode a 16-bit word length. The inputs to inverters 144 and 150 are false thus their outputs are true. This causes one input of all NAND gates 152 to be true. This causes a degeneracy of the Y outputs. Y₀ and Y₄ will simultaneously be true. Similarly Y₁ and Y₅, Y₂ and Y₆, and Y₃ and Y₇ will be true. Thus eight of the thirty two read/write dual drivers 76 will be accessed.

FIG. 6C is a schematic diagram of a portion of the Y-address decoder 74 re-configured so as to decode a 32-bit word length. The inputs to inverters 144, 150, 142 and 148 are grounded causing the outputs of each to be true. This causes two inputs on all NAND gates 152 to be true. This causes a double degeneracy of the Y outputs. Thus, all even numbered Y outputs will be simultaneously true and similarly all odd numbered Y outputs will be simultaneously true. Thus, 16 of the thirty two read/write dual drivers 76 will be accessed. As described below, this permits the selection of a word of selectable length (i.e., 8, 16 or 32 bits) from the accessed row in memory 70. The bit length of the word is thus referred to as "programmable".

Access to memory 70 can now be better understood by referring to FIG. 7 wherein one of the thirty-two read/write drivers 76 is schematically depicted. A data bit D0 is provided from a data input bus to input 156 of inverter 158. The bit D0 is also provided to the input of a tristate inverter 160. The output of inverter 158 is similarly coupled to the input of a second tristate inverter 162. The output of tristate inverter 160 represents the bit B0 which is coupled to a corresponding column line of the memory cell, such as line 92 as shown in FIG. 4. The output of tristate inverter 162 is the bit B0 similarly coupled to a column line, such as line 90 of the memory cell of FIG. 4. Sixty-four such pairs of tristate inverters 160 and 162 are provided among the thirty-two dual drivers 76 to accommodate the sixty-four columns of memory 70.

Tristate inverters 160 and 162 are controlled by an address output derived from Y address decoder 74, such as from the output of inverter 154 of FIG. 6. Tristate inverters 160 and 162 are also controlled by a read/-write signal, W/R̄. The particular address of read/write circuit cells is selected by the appropriate address coming into the read/write circuitry 76 from Y address decorded 74. The output of inverter 154, for example, the signal, Y0, is provided to the address input 164 of NAND gate 166. The other input 168 to NAND gate 166 is the signal W/R̄. The output of NAND gate 166, in turn, is coupled to a low enable input of inverters 160 and 162 and to the input of an inverter 170. The output of inverter 170 in turn is coupled to a high enable input of inverters 160 and 162. As long as the output of NAND gate 166 is false, tristate inverters 160 and 162 will be enabled and have an output equal to the inverse of their input, otherwise their output will float. Therefore, if the read/write cell 76 is selected by having input 164 true and the read/write singal is active, the output of NAND gate 166 will be false, thereby enabling tristate inverters 160 and 162. The data bit presented at input 156, D0, will thus be written into memory 70 as bits B0 and B̄0. If data is to be read, the input 168 will be false thereby causing tristate inverters 160 and 162 to float. However, the line 80 is coupled to an input 172 of inverter 174. The output of inverter 174 in turn is coupled to the input of a tristate inverter 176. The high enable input of tristate inverter 176 is coupled to the signal Yi at input 164 (with the low enable input also coupled to Ȳi derived from inverter 178). Therefore, in an addressed read/write cell 76 during a read mode, tristate inverters 160 and 162 will float and the data addressed on B0-input 172 will be presented at the output 180 of the tristate inverter 176 as output bit Q0. Thus, when address Yi is true Q0 is enabled and its output will be either the contents of the memory cell accessed by the Y address decoder or the data at the D0 input depending upon the state of the read/write signal.

FIG. 7 also shows a duplicate set of inverters and tristate inverters similar to those corresponding to tristate inverters 160, 162 and 176. These perform in an identical fashion in conjunction with the signals Y and W/$\overline{R}$ with the exception that their corresponding tristate inverters are coupled to the next adjacent column lines B1 and $\overline{B1}$. Therefore, a signal address Yi at input 164 serves to simultaneously select two adjacent bits. As further illustrated in connection with FIG. 6, each Yi address Y0-Y7 is simultaneously coupled to a group of four such dual drivers 76. Therefore, each Yi address (signal Yi in FIG. 7) signal will cause 8 bits to be written or read depending upon the state of the signal W/$\overline{R}$.

Returning again to FIG. 7, it should be noted that any number of Q outputs 180 from dual drivers 76 may be tied together to a common output bus since these outputs are from a tristate inverter like tristate inverter 176. By using a metal mask option to tie such floating outputs, in conjunction with the Y address decoder programming, the programmable word length of the invention is achieved as described below. This is best understood by now turning to FIGS. 8a and 8b.

Figure 8A:
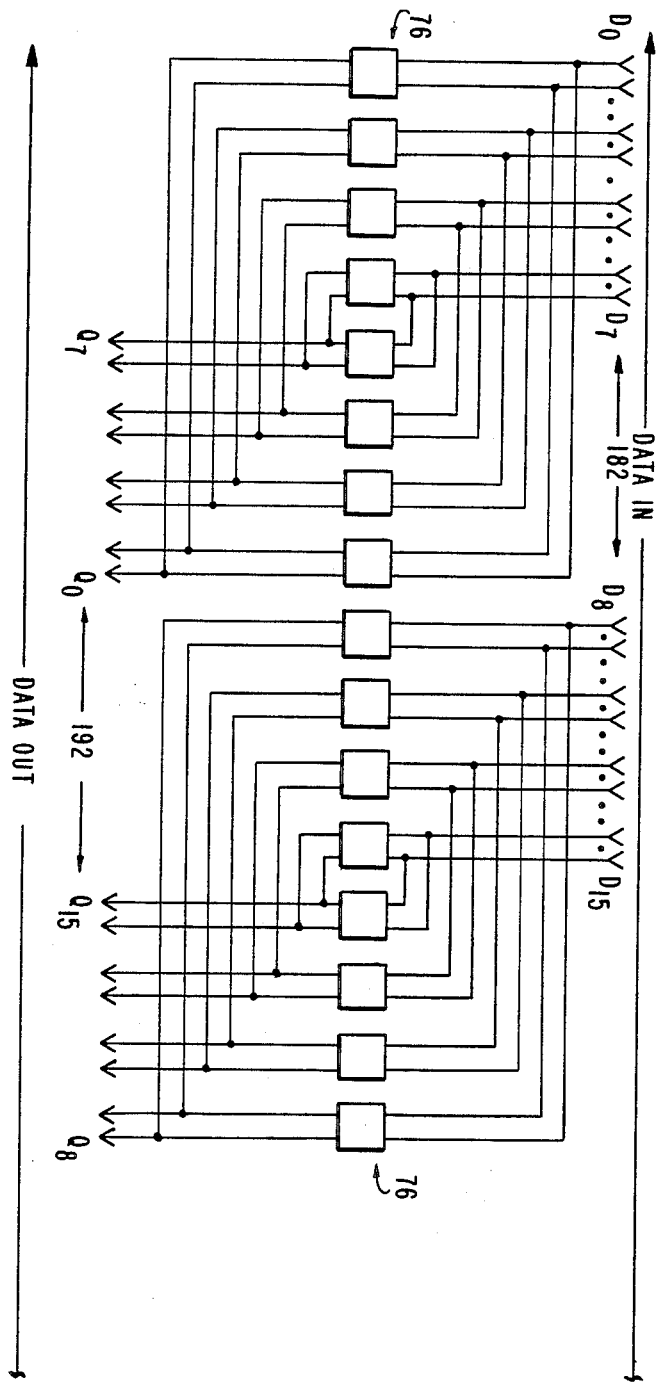
FIGS. 8a and 8b together comprise a schematic diagram of a word length programming cirucit as used in the memory of FIG. 3.
Figure 8B:
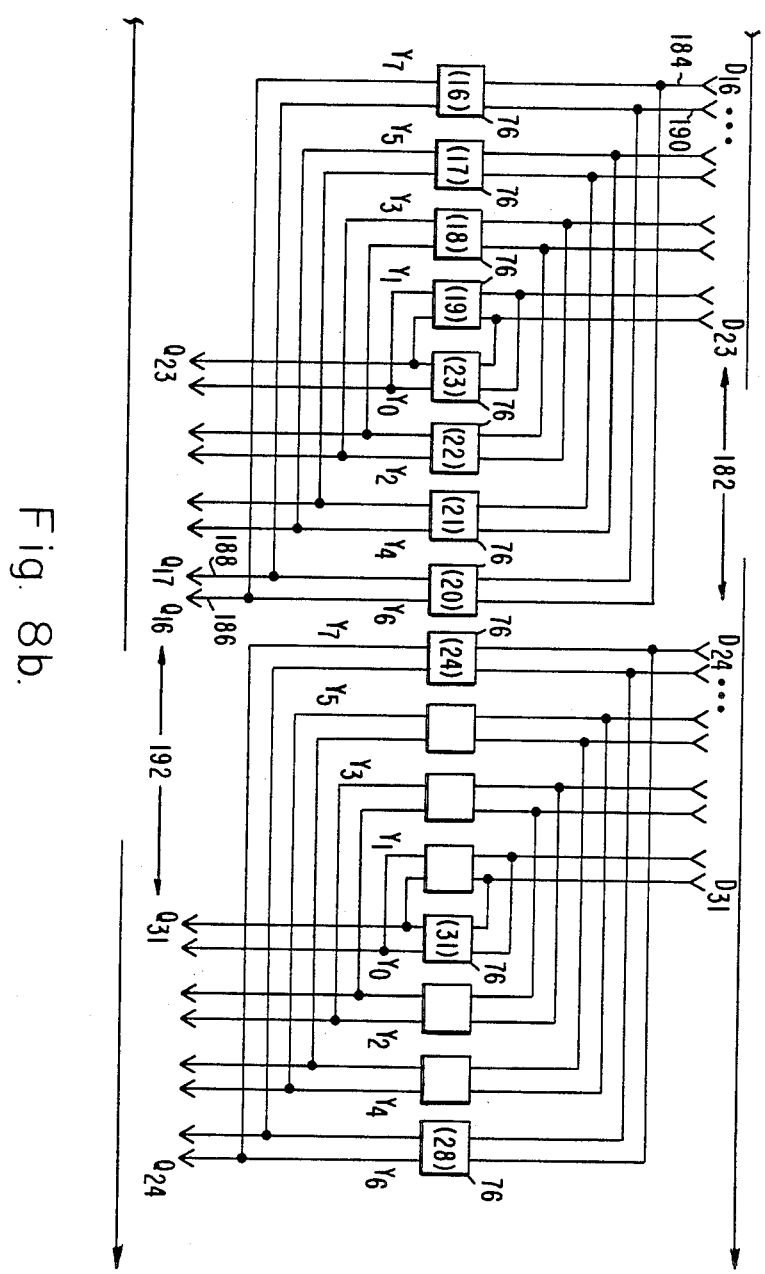

FIGS. 8a and 8b are a schematic wherein the 32 bit mode is assumed, that is, wherein memory 70 is treated as storing 32 bit-length words. A data input bus generally denoted by reference numeral 182 and represented by the collection of inputs D0-D31 is depicted across the top of FIGS. 8a and 8b. Each data input signal, such as signal D16 for example, is provided to the data input terminal of two distinct dual drivers 76. Data bit D16 at input 184 is coupled to the second data input terminal of dual driver 76 (16) corresponding to the 16th order bit of the 32 bit word and to the second data input of dual driver 76 (20). The data outputs of dual drivers 76 (16) and 76 (20) are commonly coupled at output 186 to provide the output bit Q16. Similarly, the next adjacent data bit D17 is commnly coupled to the first data input to dual driver 76 (16) and to the first data input of dual driver 76 (20). Again, the first data outputs of dual driver 76 (16) and 76 (20) are coupled in common to data output 188 corresponding to data output bit Q17.

Therefore, by the metalization option chosen and by redundantly coupling paired data inputs and outputs of dual drivers 76, the sixty-four possible distinct dual drivers are treated in a pair-wise fashion to form a collection of sixteen distinguishable pairs.

FIG. 8B also depicts the Y address as connected to each of the dual drivers 76. Since in the 32-bit word length mode the Y decoder is doubly degenerate, $Y_0$, $Y_2$, $Y_4$ and $Y_6$ are simultaneously true and alternately $Y_1$, $Y_3$, $Y_5$ and $Y_7$ are true, either dual drivers 16, 17, 18 and 19 or drivers 20, 21, 22 and 23 are enabled. The other dual drivers 76 are similarly accessed such that either one set of 16 dual drivers 76 or the alternate set of 16 is accessed. Thus, in the 32-bit word length mode, the Y decoder acts as a one-of-two select. Therefore data is presented on a common bus $Q_0$-$Q_{31}$, as a 32-bit word and can be written into or read from memory 70 as a 32 bit word.

Similarly, in the 16-bit word length mode, the Y address decoder acts as a one-of-four select. By coupling dual drivers 76 having Y addresses $Y_0$, $Y_1$, $Y_2$ and $Y_3$ together in groups of four and similarly coupling dual drivers with Y addresses $Y_4$, $Y_5$, $Y_6$ and $Y_7$, eight of the dual drivers will be alternately selected. Because there are two bits per driver 76 this yields a 16-bit word that can be written into and read from memory 70.

For the 8-bit word length mode, the Y address decoder acts as a one-of-eight select. By coupling dual drivers with addresses $Y_0$ through $Y_7$ in groups of eight, four of the dual drivers will be alternately selected yielding an 8-bit word.

Clearly, sixty-four bits could have been provided on input data bus 182 to provide sixty-four output bits Q0-Q63 as an output data bus generally denoted by reference numeral 192, by uniquely associating each input and output bit with only one of the two input and output data terminals of the thirty-two dual drivers 76.

For this case the Y address decoder would be programmed as fully degenerate by making the inputs to inverters 140, 142, 144, 146, 148 and 150 of FIG. 6A false. This will cause all Y addresses to be always true thus always selecting all of the thirty two drivers and providing a 64-bit word length.

The circuitry of FIGS. 3-8b set forth a memory design with a programmable word length which is of general utility both within a semicustom chip or in standard design and custom chips. However, in large scale integration (LSI), small memories such as that described and particularly a utility memory which is generally programmable, can be expected to be housed totally on the chip without direct input or output through the pins. Knowing whether or not the memory is functional when it is thus inaccessible becomes a substantial problem. Turn now to FIG. 9 wherein a memory self-test circuit is described, again which is of general utility, but which is particularly adaptable for a gate array.

Figure 9:
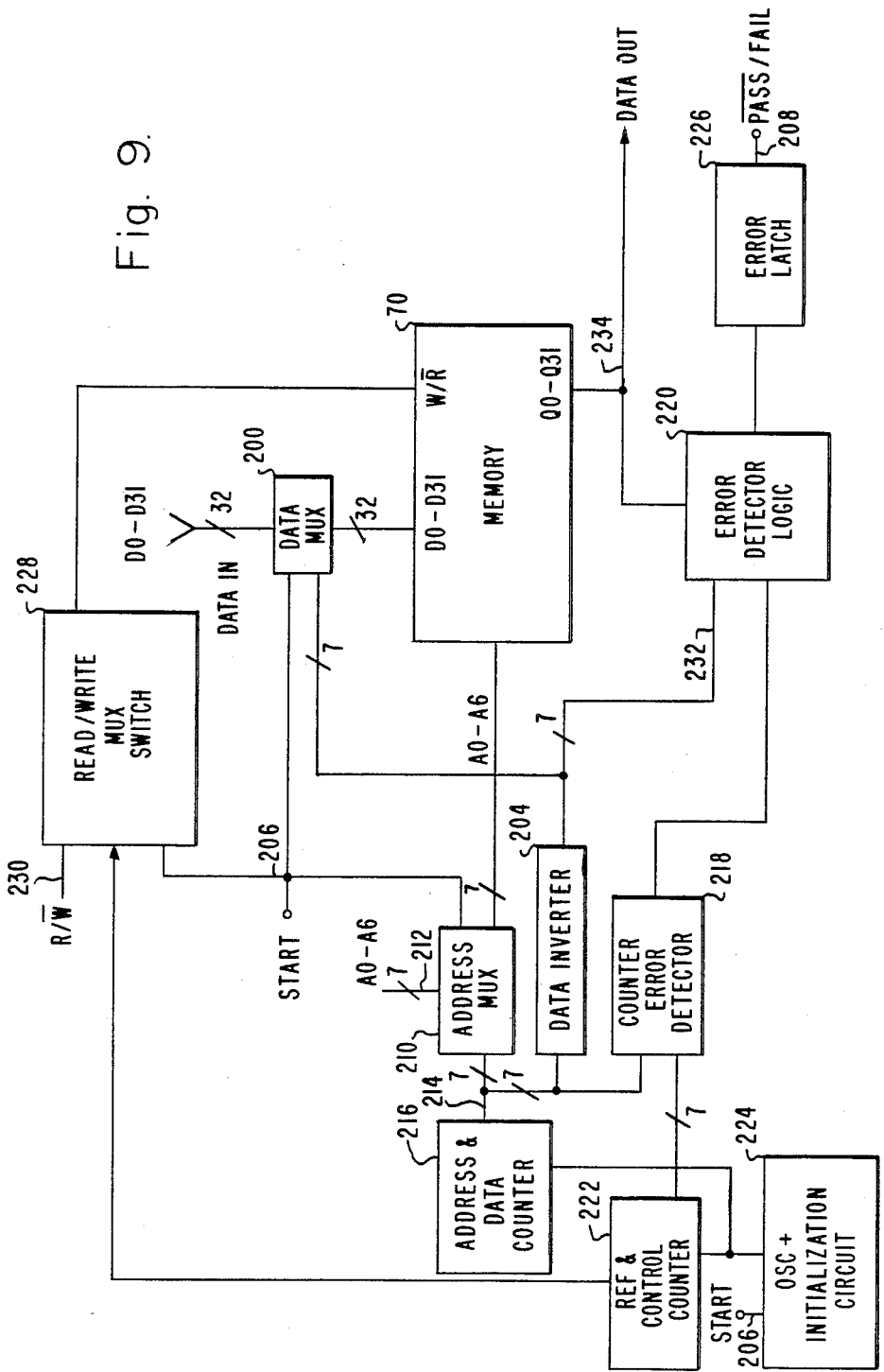
FIG. 9 is a schematic block diagram of a memory self-test circuit according to the invention.

FIG. 9 is a schematic block diagram illustrating the overall architecture of the memory self-test circuitry. Memory 70 is illustrated with seven address inputs A0-A6, thirty-two data inputs D0-D31, a read/write control signal W/$\overline{R}$, and thirty-two output signals Q0-Q31. A data multiplexer 200 provides the data input signals D0-D31 to memory 70 either from a data input bus 202 or from a data inverter 204 described below. Data multiplexer 200 is controlled by a START signal provided on an input pin 206. Pin 206 is the only required input access available to the self-test circuitry of FIG. 9. An output pin 208 upon which a failure or pass signal will be presented, is its only required accessible output. The START signal on input pin 206 is used to instruct data multiplexer 200 to either take data from data inverter 204 or from a data input bus 202. Similarly, addresses A0-A6 of memory 70 are provided by an address multiplexer 210. Address multiplexer 210, in turn, has its inputs coupled either to an address bus 212 or to an address and data counter output signal 214 generated by address and data counter 216. The generated addressand-data-counter signal is also provided as inputs to data inverter 204 and a counter error detector 218. The outputs of data inverter 204 and counter error detector 218 are each provided as inputs to an error detection logic circuit 220. An additional input is provided to counter error detector 218 from a reference and control counter 222. Address and data counter 216 and reference and control counter 222 are both, in turn, driven or controlled by an oscillator and initialization circuit 224 which, in turn, is responsive to the START signal at input pin 206. For ease of illustration, input pin 206 has been shown in multiple locations in FIG. 9 although, in fact, a single input pin 206 is provided in the actual chip. The output of error detection logic 220, in turn, is coupled to the input of an error latch 226 which generates the pass/fail signal at output pin 208. Read/write multiplexer switch 228 which is responsive to (a) the read/write signal provided at input 230, (b) the reference control counter and (c) to START signal at input pin 206, is used in a manner described in more detail below to provide the W/R̄ signal for memory 70.

The overall architecture of the self-test circuit having been described with reference to FIG. 9, its general mode of operation can now be described in detail. The START signal on input pin 206 is active low. A logical zero is placed on pin 206 and the pass/fail signal on output pin 208 should also go and remain low unless, during the test mode, the memory 70 is found to be defective. As will be described below in greater detail, the self-test feature of the invention is also designed to accommodate the programmable word length feature described in connection with memory 70 in relation to FIGS. 3-8b.

According to the protocol of the self-test circuitry, both a logical one and a logical zero is written into each memory location within memory 70. Memory 70 is then read to insure that the correct information which was written into each particular location is, in fact, read out. Specifically, the address of each memory location is written into that particular memory location and then read out to check for operability. Then the logical inverse of the address location is written into the same memory location and read out again to insure that the data is correct and memory 70 is operable. In this manner, each cell within the memory has a logical one and a logical zero written into it and tested.

The sequencing of address and data is provided by address and data counter 216. Output 214 of address and data counter 216 is applied to memory 70 through address multiplexer 210 as the address of the memory in which data is to be stored, and the same output 214 is provided through data inverter 204 and treated as the data to be stored in the addressed memory location. Output 232 from data inverter 204 is coupled to memory 70 through data multiplexer 200. During the self-test mode, the data multiplexer 200 and address multiplexer 210 decouple memory 70 from address bus 212 and data input bus 202 so that memory 70 is accessible only from address and data counter 216. At the completion of self-test, multiplexers 200 and 210 return to their normal access mode to address bus 202 and data bus 212.

A reference and control counter 222 is used to detect any errors within address and data counter 216. If either address and data counter 216 or reference and control counter 222 are in error, a fail signal will be generated at output pin 208. Reference and control counter 222 also controls a specific read/write signal and controls whether the data which is being read into memory 70 during the self-test mode is to be inverted or not. This latter operation is described in greater detail in connection with FIGS. 10a-12. Reference and control counter 222 also includes logic which will stop the self-test mode at its completion and return the circuitry of FIG. 9 to normal operation at the end of the self-test mode.

Error detection logic 220 accepts data from data output bus 234 from memory 70 and from address and data counter 216 through data inverter 204. Error detection logic 220 combines these two inputs in an exclusive-OR function on a bit-by-bit basis to compare the data which should be in memory with that data which was actually written into and read from the memory. Any failure of comparison is detected by a large (many input) NOR gate 256 and is latched by error latch 226. Therefore, if at any time during the self-test mode, a failure of comparison between what should be in memory and what was, in fact, in memory is found, a failure signal will be latched at output pin 208 and remain latched until the self-test mode is terminated.

The overall operation of the self-test circuitry of FIG. 9 now having been described, consider now the detailed circuitry and operation of each of the elements generally described above. FIG. 10 is provided as a map to assist the reader in orienting FIGS. 10a-10i with respect to one another.

Figure 10A:
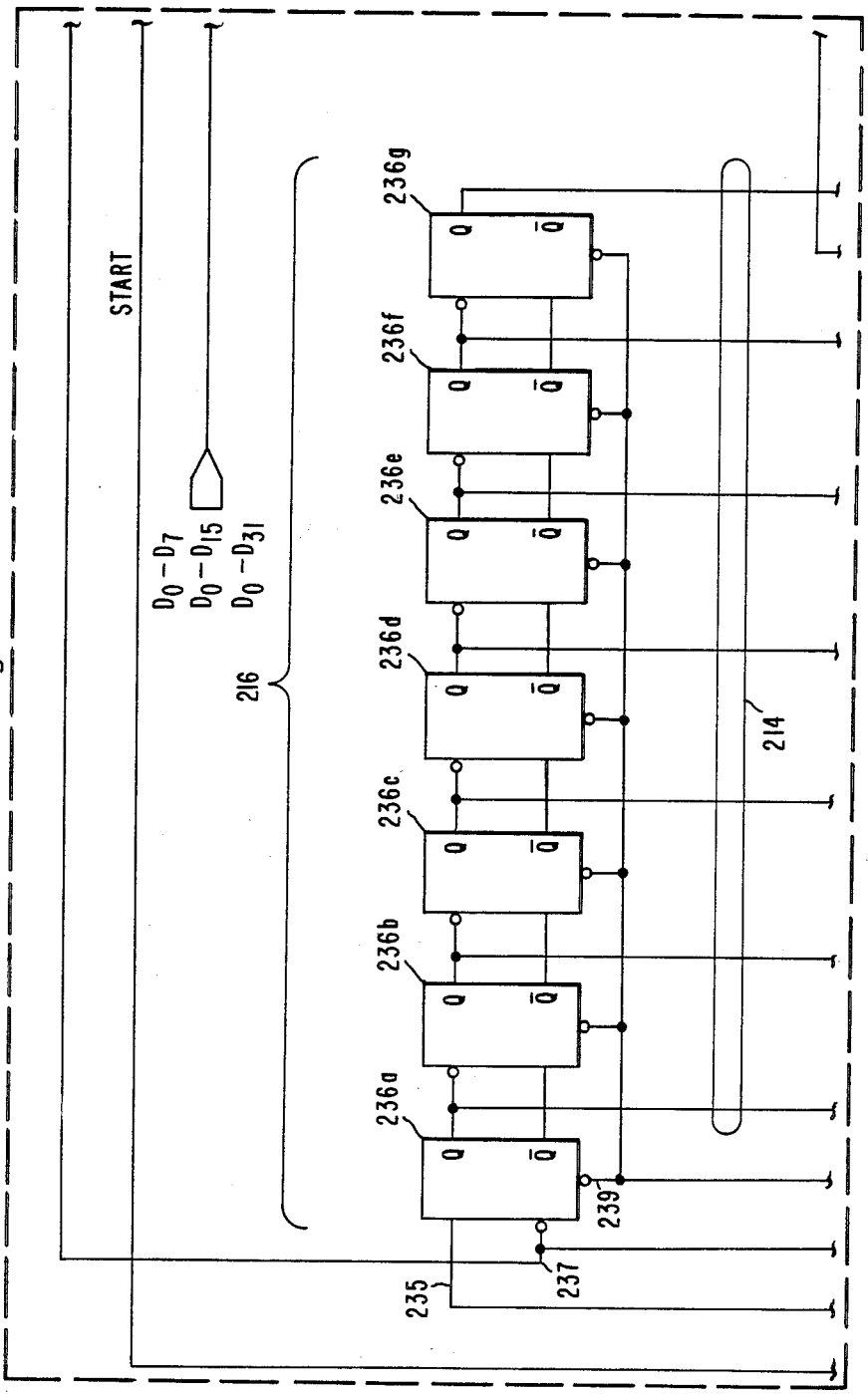
FIG. 10a is an address and data counter as used in the self-test circuit of FIG. 9.
Figure 10D:
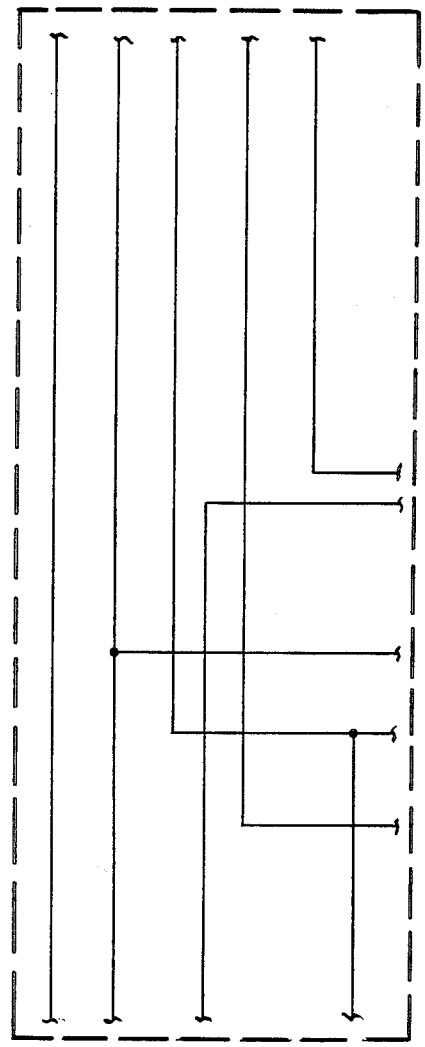
FIG. 10d illustrates the interconnection between FIGS. 10a, 10e and 10i.

Turn now to FIG. 10a wherein address and data counter 216 is schematically depicted. Address and data counter 216 is a 7 bit ripple counter with a clock input (CLK) on line 235, a clock complement (CLK̄) input on line 237, and clear (CLR) input on line 239 derived from oscillator and initialization circuitry 224 shown in FIG. 9 and described in greater detail in relation to FIG. 10i. Seven identical flip-flops 236a-236g are provided and coupled in a series to provide, at their Q outputs, a sequential count. Initially, each of flip-flops 236 are cleared and the Q outputs, generally denoted in FIG. 10a as output 214, will be 000 000 0. At the first clock pulse, the output of flip-flop 236a will toggle. Outputs 214 at this point represent the logical signal 000 000 1. Therefore, an alternating series of ones and zeros will be clocked to the Q output of flip-flop 236a. Similarly, the next adjacent flip-flop, flip-flop 236b, has its clock input coupled to the Q output of flip-flop 236a and its CLK̄ input coupled to the Q output of 236a. The remaining flip-flops 236c-g are similarly coupled so that the entire address range of the 7 bit number is generated at outputs 214.

Figure 10E:
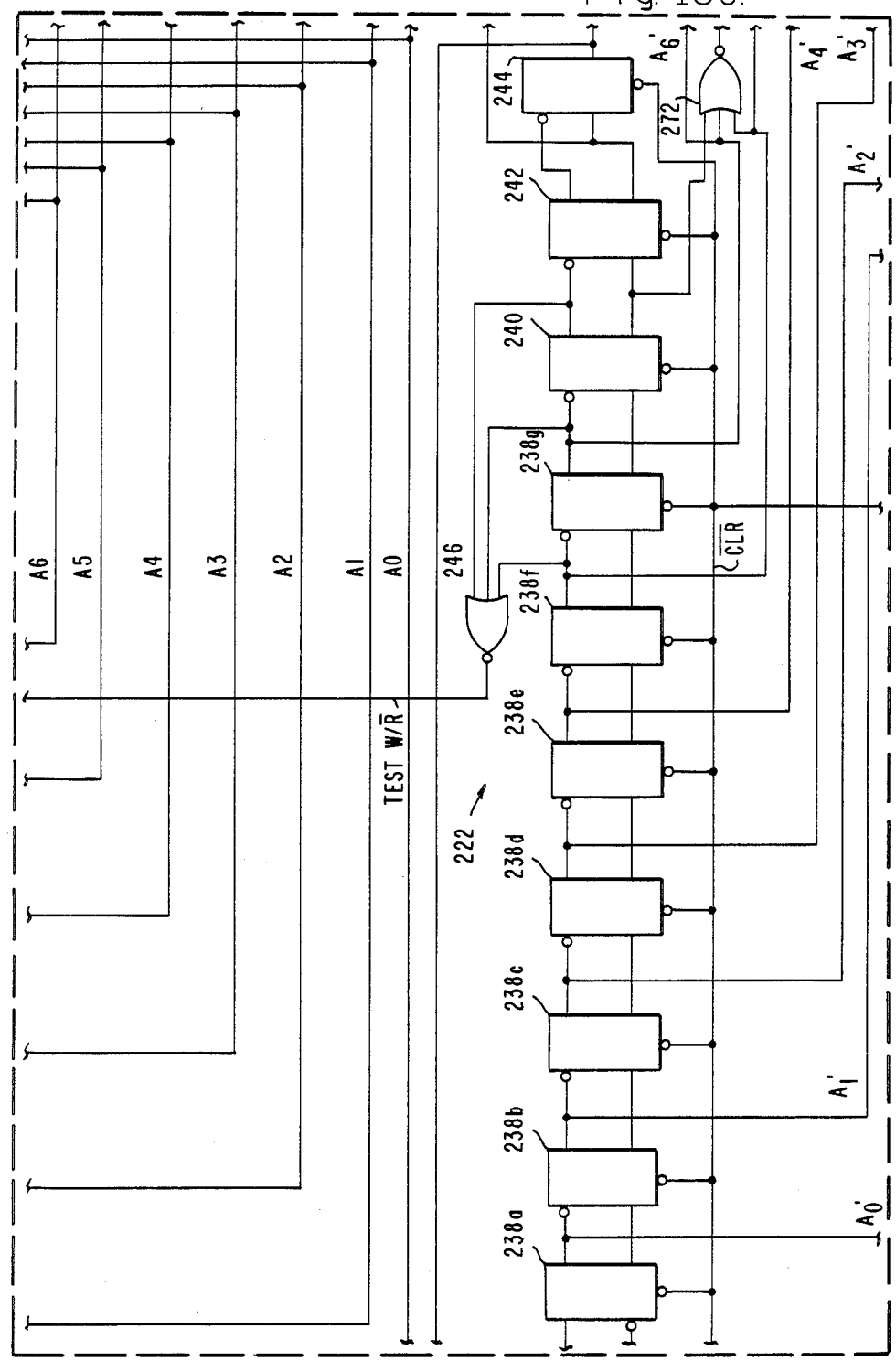
FIG. 10e is a schematic diagram of a reference and control counter as used in the self-test circuit of FIG. 9.
Figure 10F:
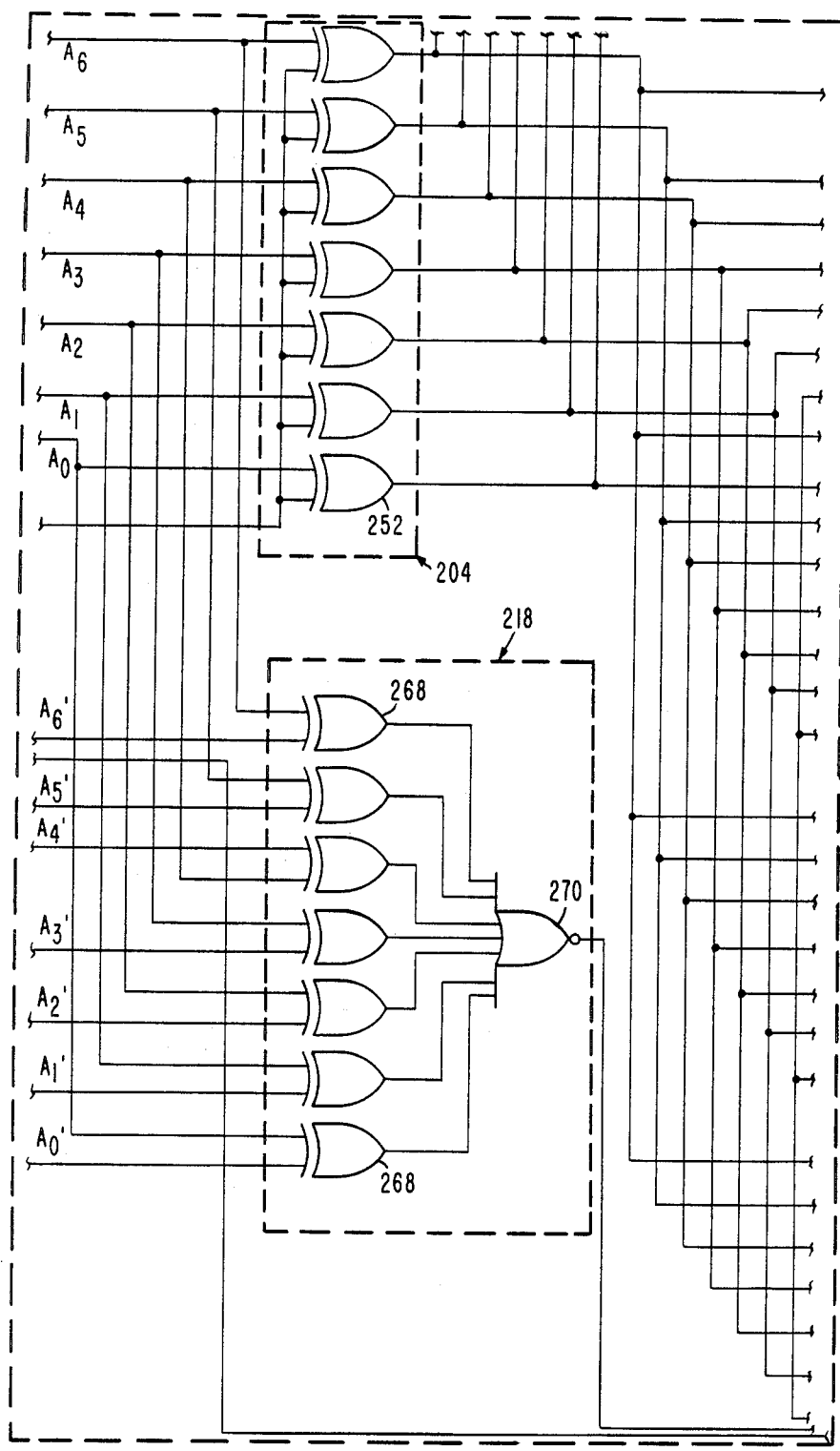

Turn now to reference and control counter 222 of FIG. 10e. Reference and control counter 222 is a 10 bit ripple counter substantially similar to that described in connection with FIG. 10a. The first seven flip-flops, 238a-g, corresponding to flip-flops 236a-g, are similarly coupled to the signals CLK, CLK̄ and CLR from oscillator and initialization circuit 224 and therefore provide a parallel count. The 8th, 9th and 10th flip-flops, 240, 242 and 244, provide control for the read/write mode, for data inversion and for self-test completion, respectively. In the illustratted embodiment, a 32 bit word is assumed and the design changes necessary to configure the circuitry in a 16 or 8 bit word are discussed below in connection with FIGS. 11 and 12, respectively.

As described previously, memory 70 is comprised of sixteen rows and sixty-four columns. Thus, if a 32 bit word is assumed, memory 70 can be thought of as holding two columns of 32 bit words with sixteen such words in each of the columns. As also described above, the rows are accessed in memory 70 by the address bits A0–A3. The 64 bit-columns within memory 70 are accessed through bits A4–A6 which are decoded to produce eight distinct column addressing signals, each of which will simultaneously access eight single bit-columns. Therefore, in order to access a 32 bit word, four such column access signals must be generated among the eight. This means that a single bit, such as A4, is sufficient to designate whether you are accessing the first 32 bit-column or the second 32 bit-column within memory 70. Thus, the Q outputs of flip-flops 238f and 238g are coupled together with the Q output of flip-flop 240 to a NOR gate 246. The output of flip-flop 238f corresponds to the column accessing signal A5 while the output of flip-flop 238g corresponds to the column accessing signal A6. Therefore, if the address has increased so that either A5 or A6 is a one, this will mean that A4, the output of flip-flop 238e, will have cycled between its two possible states and both the first and second 32 bit words will have been accessed from each of the 16 rows of memory 70. The Q output of flip-flop 240 will, however, remain low until each of the possible addresses A0–A6 have been generated. On the next clock pulse the state of flip-flop 240 will change indicating that the write cycle is over and that a read cycle may begin as each of the addresses A0–A6 are again sequenced by address and data counter 216 through the possible range of addresses. Therefore, the output of NOR gate 246 during the initial write cycle in the 32 bit mode will be true until either A5 or A6 go true after which time it will remain false. After the entire write cycle has been executed, the Q output of flip-flop 240 will then maintain the output of NOR gate 246 false during the subsequent read cycle. The output of NOR gate 246 is the signal, TEST W/$\overline{R}$.

Turning briefly to FIG. 10b, the TEST W/$\overline{R}$ signal is provided as one input to NAND gate 248, the other input of which is $\overline{CLK}$. Address and data counter 216 is changing state during $\overline{CLK}$. Therefore, NAND gate 248 is inhibited during $\overline{CLK}$ by being driven to produce a signal which will force memory 70 into a read mode so that its contents cannot be altered as counter 216 is in transition. The output of NAND gate 248 is coupled through read/write multiplexer switch 228 and inverter 250 to the W/$\overline{R}$ input of memory 70. Therefore, the memory will be written into whenever the clock signal is low and the signal TEST W/$\overline{R}$ is true.

Figure 11:
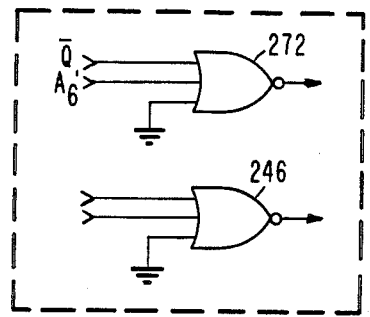
FIG. 11 is a configuration of two of the gates within the reference and control counter-circuit of FIG. 10e showing the configuration used in a 16 bit mode.

Turn now to FIG. 11 wherein NOR gate 246 is illustrated in isolation of reference and control counter 222 to show its input configuration when used in the 16 bit mode. When the word is considered 16 bits in length, memory 70 can then be conceptualized as four columns of 16 bit words with sixteeen rows in each column. In that case, two Y address bits A4 and A5 are required to uniquely address the four columns within memory 70. Therefore, FIG. 11 shows that one input of NOR gate 246 which, in the embodiment to FIG. 10e is shown as coupled to the Q output of flip-flop 238f, will instead be grounded. The remaining inputs to NOR gate 246 remain as before. Therefore, a sufficient number of distinguishable addresses will be generated during the write cycle according to the control resulting from the output of NOR gate 246, the signal TEST W/$\overline{R}$.

Figure 12:
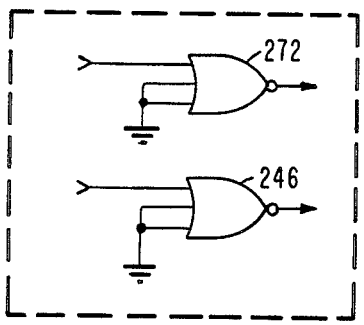
FIG. 12 is a schematic diagram of two of the same gates as discussed in connection with FIG. 11 which are incorporated within the reference and control counter-circuit of FIG. 10e but which are configured according to the invention in an 8 bit mode.

Similarly, turning to FIG. 12, NOR gate 246 is illustrated in the case where the word length is 8 bits. Again in that case, memory 70 is conceptualized as eight columns of 8 bit words with sixteen rows in each column. Now, all three Y address bits A4–A6 are required to produce eight distinguishable decoded signals. The only input to NOR gate 246 is the Q output of flip-flop 240 which signals the end of the sequence of address generation of all of the utilized bits A0–A6.

While the addresses are being generated by address and data counter 216 during the write cycle as controlled by reference and control counter 222, the data (which is the generated address) is coupled through data inverter 204 (see FIG. 10f) through data multiplexer 200 to data input bus 202 of memory 70. Data inverter 204 is comprised of a plurality of exclusive-OR gates 252, each of which have one input coupled to a corresponding one of the signals A0–A6 from address and data counter 216 and one input coupled to the $\overline{Q}$ output of flip-flop 242 in reference and control counter 222 of FIG. 10e. Returning to FIG. 10e, flip-flop 242 is the next higher order flip-flop in the 10 bit ripple counter after flip-flop 240. Flip-flop 242, as previously stated, controls the data inversion. During the first write cycle, the Q output of flip-flop 242 will be true, thereby inverting the data presented at the input of data inverter 204. During a second write cycle, flip-flop 242 will change state and hence the noninverted address will be written as data into the accessed memory locations.

However, as shown in the illustrated embodiment, only seven bits A0–A6 are provided with each clock cycle. These seven bits are multiply-mapped by multiplexer 200 into the 32 bits at each memory location. The maping is generally arbitrary but, in the illustrated embodiment, the values of signals A0–A6 are mapped into the memory bit lines B0–B6, described above in connection with FIG. 10f. Bit line B7 is mapped with address signal A6. In addition, the signals A0–A6 are then mapped into each corresponding eighth order higher bit. For example, A0 is mapped into the bits B0, B8, B16 and B24 while A1 is mapped into bits B1, B9, B17, B25 and so forth. The bit A6 is mapped into the memory bits B6, B7, B14, B15, B22, B23, B30 and B31.

Figure 10G:
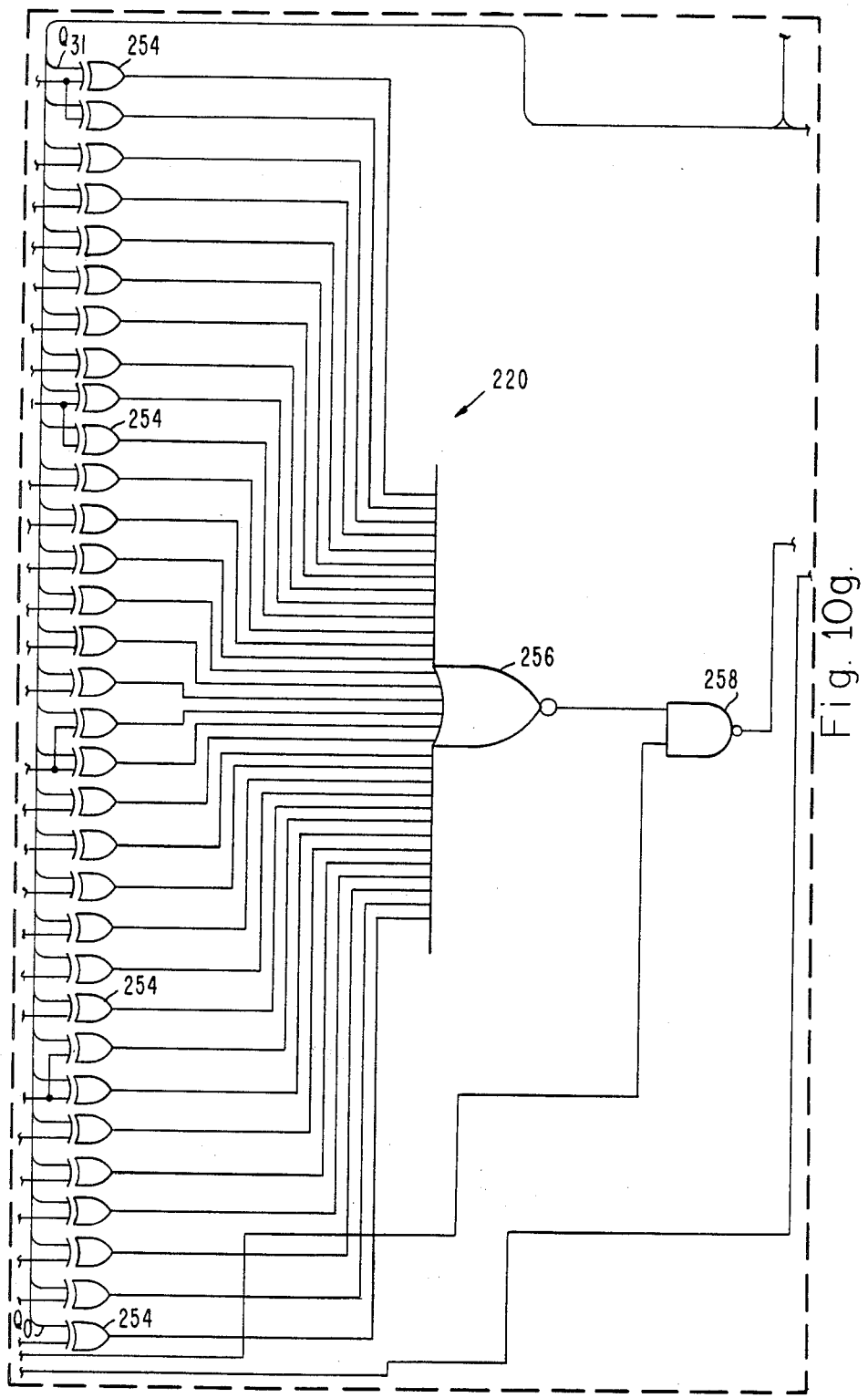
Figure 10H:
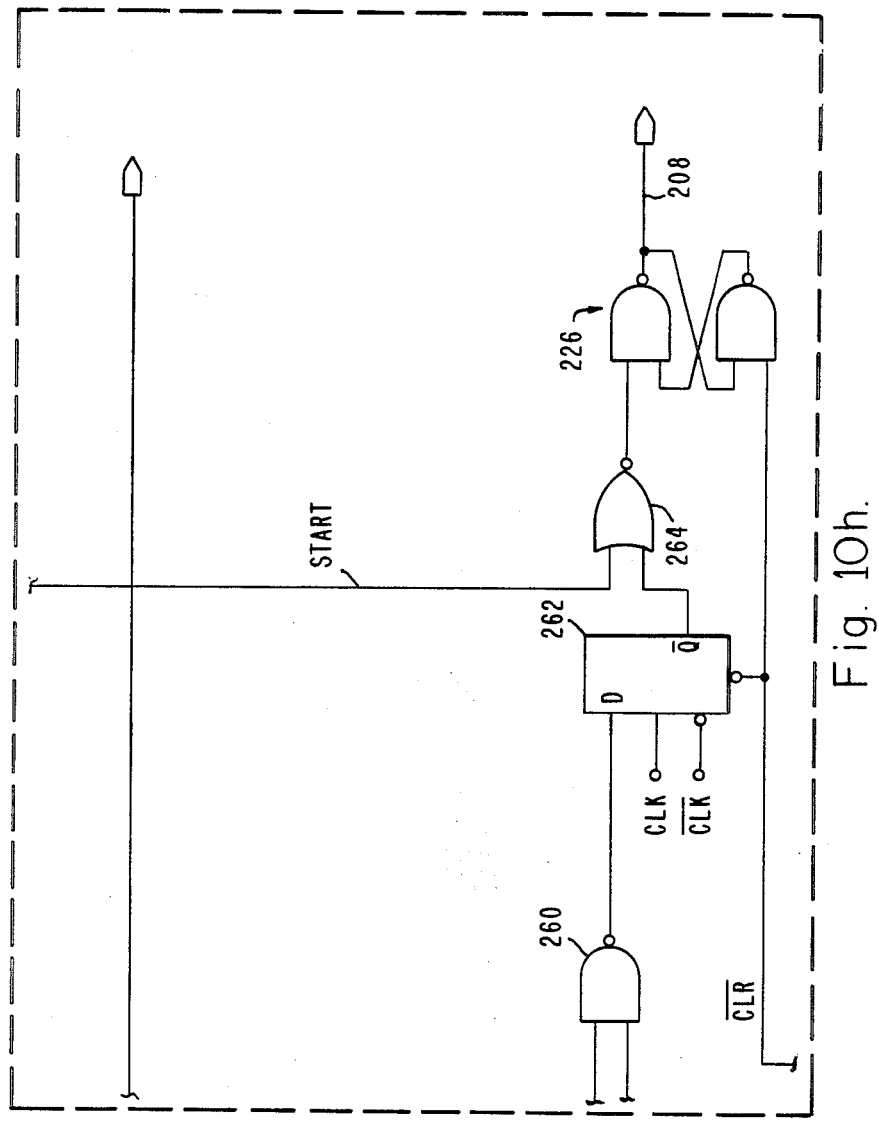

Therefore, in the illustrated embodiment, after the inverse of the data has been loaded into the memory 70, a read cycle is executed when flip-flop 240 of FIG. 10e changes state (assumes logical state 1). Address and data counter 216 again generates a full cycle of memory addresses with the exception that the memory is being read during this cycle. Data output bus 234 of memory 70 is coupled to a corresponding plurality of thirty-two exclusive-OR gates 254, as shown in FIG. 10g, which are included within error detection logic 220 of FIG. 9. The other inputs to exclusive-OR gates 254 are taken from the output of data inverter 204 according to the bit mapping described above in connection with multiplexer 200. In other words, the data output bit Q31, Q30, Q23, Q22, Q15, Q14, Q7 and Q6 are each associated pair-wise in an exclusive-OR gate 254 with a signal from inverter 204 corresponding to A6. The output of gate 254 is coupled to a large NOR gate 256. Therefore, exclusive-OR gates 254 will have a zero output as long as there is a valid comparison. As long as all of exclusive-OR gates 254 provide a zero input to NOR gate 256, the output of NOR gate 256 will remain true. During a read when a comparison is being made, the true output of NOR gate 256 is coupled through NAND gate 258, which will be described below, inverted thereby and provided as input to NAND gate 260, (FIG 10h) also described in greater detail below. NAND gate 260 will be enabled during a read cycle for comparison and will load the true value from NOR gate 256 to the D input of flip-flop 262. The $\overline{Q}$ output of flip-flop 262, which will be zero if NOR gate 256 is true, is then coupled through a NOR gate 264, which is enabled by the active low START signal serving as its other input. Finally, the true value from the output of NOR gate 264, again corresponding to the true output of NOR gate 256, is set into an RS latch, generally denoted by reference numeral 226, whose output, in turn, is the signal pass/fail which, in this case, will be false. If any one of exclusive-OR gates 254 shows a failure of comparison during any part of a read cycle, the output of large NOR gate 256 will be false and ultimately pass-/fail would be true.

Gates 258, 260 and 264, described in connection with error detection logic 220 above, are each enabling control gates which serve to inhibit a comparison or test under certain circumstances. Consider, for example, counter error detector 218 shown in FIG. 9 and in FIG. 10f in a more detailed schematic. Counter error detector 218 is comprised of a plurality of exclusive-OR gates 268. Each exclusive OR gate 268 has two inputs, one corresponding to a given order address from address and data counter 216 and another corresponding to the same order address from reference and control counter 222. As long as both counters continually match, the outputs of exclusive-OR gates 268 will remain zero. Each of these outputs are coupled to a NOR gate 270. Therefore, as long a there is valid count simultaneously in counters 216 and 222, the output of NOR gate 270 will remain true, otherwise it will be false. The output of NOR gate 270 is provided as a second input to NAND gate 258. As described above, the first input to NAND gate 258 is the output of NOR gate 256, which is indicative of a valid comparison. If for any reason the counters are not at the same count, comparison will be inhibited by a false output from NOR gate 270 coupled as one input to NAND gate 258. Ultimately, the true value generated at the output of NAND gate 258 will appear as a failure signal at output pin 208.

Comparison of memory contents with the data (address) that should have been written into the memory 70 occurs during a read cycle and must be inhibited during a write cycle. Turning to FIG. 10e, NOR gate 272 generates such a compare inhibit signal. The inputs to NOR gate 272 in the 32 bit mode is a $\overline{Q}$ output from flip-flop 240 and the $\overline{Q}$ outputs from flip-flops 238f and 238g corresponding respectively to the address signals A5' and A6'. During a write cycle, the $\overline{Q}$ of flip-flop 240 will be true. Therefore, the output of NOR gate 272 will remain false. The output of NOR gate 272 is coupled to the second input of NAND gate 260 described in connection with FIGS. 10f–10h. Therefore, NAND gate 260 will be inhibited during a write cycle and any comparisons which are made will not cause a failure signal to be generated at output pin 208. During a read cycle, the $\overline{Q}$ output of flip-flop 240 will be false thereby permitting a comparison and enabling gate 260 as long as valid addresses continue to be generated.

Because in the 32-bit word length mode the Y address is doubly degenerate, when address A5 and/or A6 is true, data will not be written into the memory on the write cycle and error comparisons will not be made during the read cycle. For the 16-bit word length mode which is singly degenerate, this will be true only when A6 is true. For the 8-bit word length mode, writing and comparsion will be done on each clocking of the write and read mode respectively.

FIGS. 11 and 12 again depict an input configuration for gate 272 in the 16 and 8 bit mode, respectively. Turning to FIG. 11, for example, gate 272 will have one of its inputs grounded and the other two inputs, which are coupled to the $\overline{Q}$ output of flip-flop 240 and the $\overline{Q}$ output of flip-flop 238g corresponding to the signal A6', remain the same. Similarly, turning to FIG. 12, two of the inputs of NOR gate 272 will be grounded or false when configured in the 8 bit mode, while the remianing single input is coupled to the $\overline{Q}$ output of flip-flop 240.

Turn again to FIG. 10e. The tenth flip-flop 244 is a test cycle control flip-flop and is the last flip-flop in the 10 bit ripple counter comprising reference and control counter 222. According to the self-test cycle protocol, inverted data is first written into the memory under control of flip-flop 240 and then read again as determined by flip-flop 240. Thereafter, pursuant to control of data inversion flip-flop 242, noninverted data is then read and written as determined by control of flip-flop 240. After these write and read cycles are completed, self-test control flip-flop 244 will then change state. The $\overline{Q}$ output of flip-flop 244 goes from a false output to a true input designated as the end-of-test signal. This signal is coupled to oscillator and initialization circuit 224, shown in FIG. 9, which will now be described in greater detail in connection with FIG. 10i.

Figure 10I:
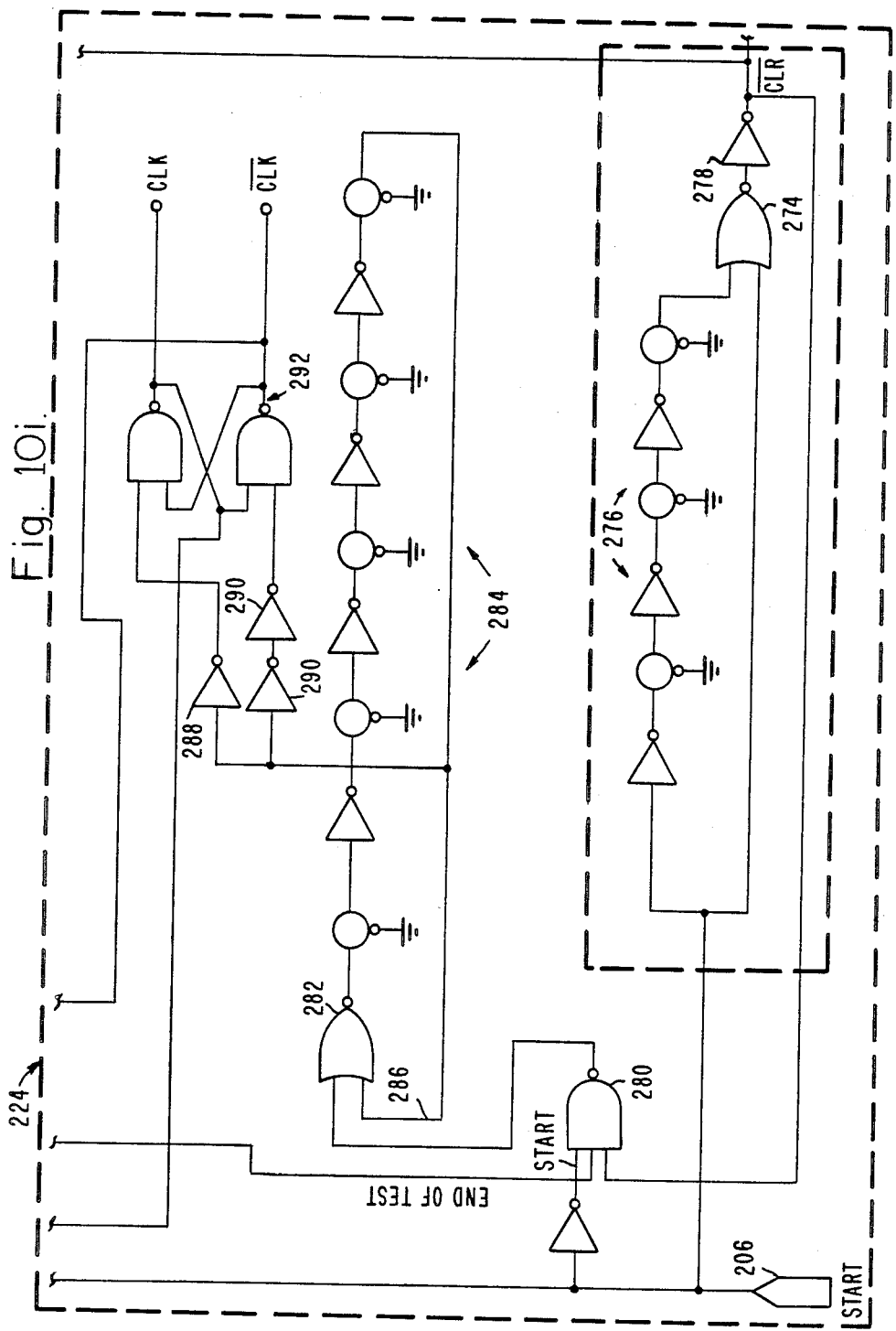
FIG. 10i is a schematic diagram of the oscillator and initialization circuit as used in the self-test circuit of FIG. 9.

Turn now to FIG. 10i. The START signal is provided at input pin 206. The START signal is simultaneously coupled to one input of a NOR gate 274 and to the input of a series of inverters and transmission gates collectivley denoted by reference numeral 276. Thus, initially the inputs to NOR gate 274 are one and zero thereby maintaining a zero output which is inverted by inverter 278. The output of inverter 278 is a clear signal, CLR. After a transmission delay as determined by devices 276, the second input of NOR gate 274 also goes false and the clear signal CLR goes true. Thus, a START signal activitates a one-shot clear signal used throughout the circuitry, and in particular to initialize and clear counters 216 and 222. The signal $\overline{CLR}$ is also used to inhibit the oscillator 284. $\overline{CLR}$ is provided as one input to NAND gate 280. Therefore, when $\overline{CLR}$ is active low, gate 280 is inhibited and will not respond to its other inputs which are the end-of-test signal taken from the output of flip-flop 244 and the START signal.

The output of NAND gate 280 is coupled to NOR gate 282. The oscillator 284 is a free-running ring oscillator which produces the output signals CLK and $\overline{CLK}$. If the clear signal is not active and the START signal is active, the output of NAND gate 280 will be false. A zero at input of NOR gate 282 inverts the signal at the other input of NOR gate 282 which propagates through a delay of an even number of inverters and transmission gates, collectively denoted by reference numeral 284. After such a delay, input 286 then changes state and its inverse is again generated at the output of NOR gate 282. Thus, gate 282 continues to oscillate as determined by the time delay of devices 284. Input 286 is also coupled to inverter 288 and inverters 290. The output of inverter 288 is coupled to the SET input of RS latch 292. The output of the last of the two inverters 290 is similarly coupled to the RESET input of RS latch 292. The oscillating value on input 286 is thus ultimately used as oscillating SET and RESET inputs to RS latch 292 which then provides the clock signals CLK and $\overline{CLK}$ as its output.

The overall operation of the self-test circuit can now be understood in its entirely. Initially, a START signal goes active low at input 206. Initially, the output of inverter 278, the clear (CLR) signal, is inactive high. The arrival of the START signal drives it momentarily low with a one-shot pulse. While $\overline{CLR}$ is low, NAND gate 280 is inhibited and the START signal at its input does not cause the ring oscillator 284 to oscillate. After the clear signal goes inactive, the START signal is then coupled through gate 280 and the ring oscillator 284 begins to function. As soon as the clock signals CLK and $\overline{CLK}$ begin to be generated by the ring oscillator 284 and, more particularly, by latch 292, an address is generated by address and data counter 216 and reference and control counter 222. These two addresses are compared in counter error detector 218 comprised of exclusive-OR gates 268, the outputs of which are coupled through NOR gate 270 to NAND gate 258. Ultimately, a failure signal would then be generated at output pin 208. Upon the first occurrence of any failure signal, RS latch 266 of FIG. 10h latches the error and the remaining portion of the self-test cycle continues to termination. If the counter addresses are identical, reference and control counter 222 causes the address generated by address and data counter 216 to be written into memory 70 after inversion through data inverter 204. The adress is written in as data in the 32, 16 or 8 bit word within memory 70, according to the metallized option or programmable word length chosen for the design. Again in the illustrated embodiment, a 32 bit word length has been assumed. The mapping of the 6 bit address from address and data counter 216 is arranged in any case by data multiplexer 200. The START signal 206 also causes address multiplexer 210 and data multiplexer 200 to disconnect memory 70 from the normal data input and output bus and to be accessed only by the internal self-test control circuitry. After the inverted address is written into the address locations of memory 70 as data, reference and control counter 222 causes a read cycle to be executed in which each of the memory locations are again addressed and the data written therein compared against the inverted address in error detection logic 220. In the event that any error occurs, the error indication will be latched in RS latch 266 and provided at the output pin 208. After a first read and write cycle is completed, reference and control counter 222 then causes a second write cycle to be executed wherein the noninverted address is written into memory 70 as generated by the third pass through address and data counter 216. Once again, reference and control counter 222 causes a second read cycle to be executed and a fourth series of address signals are generated by address and data counter 216. The noninverted data within memory 70 is accessed and again compared by error detection logic 220. After both of these write and read cycles, reference and control counter 222 will generate an end-of-test signal which will be coupled to NAND gate 280 and thereby disable the ring oscillator 284. At this point, the self-test cycle has been completed and terminated.

It must be understood that many modifications and alterations may be made by those having ordinary skill in the art without departing from the spirit and scope of the invention. The illustrated embodiment has been described above only for the purposes of clarity and example and should not be taken as limiting the invention except as set forth in the following claims.

What is claimed is:

1. An improved CMOS gate array formed in a semiconductor chip comprising:

a plurality of core cells, each core cell comprising at least a first and second semiconductor device, said plurality of core cells disposed within said semiconductor chip in at least two rows in a first direction, said core cells in each row characterized by an internal configuration comprised of said first and second semiconductor devices, one said row having said internal configuration in a mirror symmetrical disposition within said semiconductor chip with respect to said adjacent row of core cells, said first direction thus defining a plane of mirror symmetry with respect to said adjacent rows of core cells, whereby implementation of complex logic functions within said gate array is substantially facilitated, and wherein adjacent core cells within each said row of core cells is repetitively duplicated within said row with respect to said internal configuration of said first and second semiconductor devices within each core cell disposed in said semiconductor chip, wherein said first and second semiconductor device comprising one core cell has a mirror symmetrical relationship with a corresponding first and second semiconductor device comprising a second core cell within said row, said mirror symmetry being established across a plane in a second direction perpendicular to said first direction after said plane of mirror symmetry is translated in the direction of said row by a distance equivalent to one of said first or second semiconductor devices.

2. The improved gate array of claim 1 wherein said first and second semiconductor devices comprise at least one P-channel and one N-channel device, the next adjacent semiconductor device in said first direction across said first plane of mirror symmetry having a channel with a matching doping type, said first semiconductor device adjacent said second plane of mirror symmetry along said second direction after said second plane of symmetry has been translated along the direction of said row by the width of one of said first or second semiconductor devices also having a matching channel type.

* * * * *